(12) United States Patent
Son

(10) Patent No.: US 11,417,659 B2
(45) Date of Patent: Aug. 16, 2022

(54) SEMICONDUCTOR MEMORY DEVICE AND METHOD OF FABRICATING THE SAME

(71) Applicant: Samsung Electronics Co., Ltd., Suwon-si (KR)

(72) Inventor: Yong-hoon Son, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 25 days.

(21) Appl. No.: 17/025,272

(22) Filed: Sep. 18, 2020

(65) Prior Publication Data

US 2021/0104526 A1  Apr. 8, 2021

(30) Foreign Application Priority Data

Oct. 8, 2019 (KR) .................. 10-2019-0124864

(51) Int. Cl.
*H01L 27/108* (2006.01)

(52) U.S. Cl.
CPC .... *H01L 27/10805* (2013.01); *H01L 27/1085* (2013.01); *H01L 27/10873* (2013.01)

(58) Field of Classification Search
None
See application file for complete search history.

(56) References Cited

U.S. PATENT DOCUMENTS

| | | | |
|---|---|---|---|
| 8,431,980 B2 | 4/2013 | Voshell et al. | |
| 8,796,090 B2 | 8/2014 | Cho et al. | |
| 9,093,311 B2 | 7/2015 | Van Buskirk et al. | |
| 9,331,083 B2 | 5/2016 | Okhonin et al. | |
| 9,361,966 B2 | 6/2016 | Nemati et al. | |
| 9,837,155 B1 | 12/2017 | Kim et al. | |
| 10,109,642 B2 | 10/2018 | Son et al. | |
| 10,978,297 B1* | 4/2021 | Luan | H01L 21/0259 |
| 2010/0038756 A1* | 2/2010 | Figuet | H01L 21/02433 |
| | | | 257/627 |
| 2018/0138199 A1 | 5/2018 | Kim et al. | |
| 2019/0067375 A1 | 2/2019 | Karda et al. | |

\* cited by examiner

*Primary Examiner* — Anthony Ho
*Assistant Examiner* — Kevin Quinto
(74) *Attorney, Agent, or Firm* — Harness, Dickey & Pierce, P.L.C.

(57) ABSTRACT

Disclosed are semiconductor memory devices and methods of fabricating the same. The method including forming a mold structure by alternately stacking a plurality of first insulating layers and a plurality of second insulating layers on a substrate, patterning the mold structure to form a first trench that exposes a first inner sidewall of the mold structure, growing a vertical semiconductor layer in the first trench such that a vertical semiconductor layer covers the first inner sidewall, using the substrate as a seed to, patterning the mold structure to form a second trench that exposes a second inner sidewall of the mold structure, forming a plurality of recesses by selectively removing the second insulating layers from the mold structure through the second trench, and horizontally growing a plurality of horizontal semiconductor layers in corresponding recesses, using the vertical semiconductor layer as a seed may be provided.

18 Claims, 39 Drawing Sheets

SEMICONDUCTOR MEMORY DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2019-0124864 filed on Oct. 8, 2019, in the Korean Intellectual Property Office, the disclosures of which are hereby incorporated by reference in their entirety.

BACKGROUND

The inventive concepts relate to semiconductor devices and/or methods of fabricating the same, and more particularly, to semiconductor memory devices with improved electrical characteristics and/or methods of fabricating the same.

Semiconductor devices have been highly integrated for satisfying high performance and low manufacturing costs of semiconductor devices which are required by customers. Because integration of semiconductor devices is an important factor in determining product prices, high integrated semiconductor devices are increasingly demanded. Integration of typical two-dimensional or planar semiconductor devices is primarily determined by the area occupied by a unit memory cell, and thus it is greatly influenced by the level of technology for forming fine patterns. However, the extremely expensive processing equipment needed for fine patterning may set a practical limitation on increasing the integration of the two-dimensional or planar semiconductor devices. Therefore, there have been proposed three-dimensional semiconductor memory devices having three-dimensionally arranged memory cells.

SUMMARY

Some example embodiments of the inventive concepts provide three-dimensional semiconductor memory devices with improved electrical characteristics and increased reliability.

Some example embodiments of the inventive concepts provide methods of fabricating a three-dimensional semiconductor memory device with improved electrical characteristics and increased reliability.

According to an example embodiment of the inventive concepts, a method of fabricating a semiconductor memory device includes forming a mold structure by alternately stacking a plurality of first insulating layers and a plurality of second insulating layers on a substrate, patterning the mold structure to form a first trench that exposes a first inner sidewall of the mold structure, growing a vertical semiconductor layer in the first trench such that the vertical semiconductor layer covers the first inner sidewall, using the substrate as a seed, patterning the mold structure to form a second trench that exposes a second inner sidewall of the mold structure, forming a plurality of recesses by selectively removing the second insulating layers from the mold structure through the second trench, and horizontally growing a plurality of horizontal semiconductor layers in corresponding recesses, using the vertical semiconductor layer as a seed.

According to an example embodiment of the inventive concepts, a semiconductor memory device includes a stack structure including a plurality of layers vertically stacked on a substrate, each of the plurality of layers including a bit line extending in a first direction and a semiconductor pattern extending in a second direction from the bit line, the second direction intersecting the first direction, a gate electrode penetrating the stack structure and vertically extending along semiconductor pattern included in each of the plurality of layers, and a data storage element electrically connected to the semiconductor pattern. The data storage element may include a first electrode electrically connected to the semiconductor pattern, a second electrode on the first electrode, and a dielectric layer between the first electrode and the second electrode. The semiconductor pattern may have a lattice defect that obliquely extends from a bottom surface of the semiconductor pattern toward a top surface of the semiconductor pattern.

According to an example embodiment of the inventive concepts, a semiconductor memory device includes a stack structure including a plurality of layers vertically stacked on a substrate, each of the plurality of layers including an insulating layer, a bit line extending in a first direction on the insulating layer, and a semiconductor pattern extending in a second direction from the bit line, the second direction intersecting the first direction, a gate electrode penetrating the stack structure and vertically extending along the semiconductor pattern included in each of the plurality of layers, and a data storage element electrically connected to the semiconductor pattern. The data storage element may include a first electrode electrically connected to the semiconductor pattern, a second electrode on the first electrode, and a dielectric layer between the first electrode and the second electrode. The semiconductor pattern may have a lattice defect therein. The lattice defect may be at an angle of 50° to 60° with respect to a top surface of the insulating layer below the semiconductor pattern.

DETAILED DESCRIPTION

Figure 1:
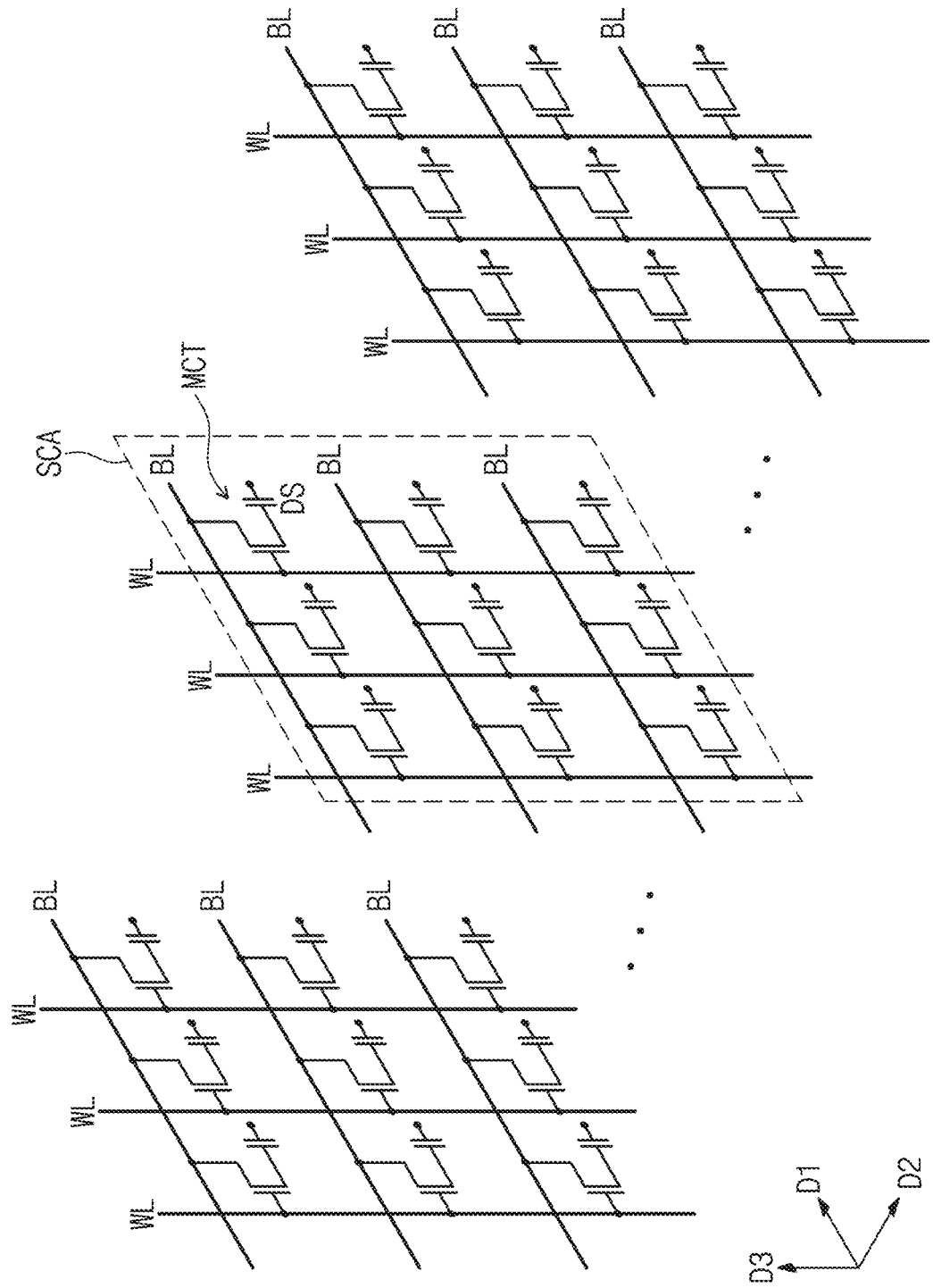
FIG. 1 illustrates a simplified circuit diagram showing a cell array of a three-dimensional semiconductor memory device according to an example embodiment of the inventive concepts.

FIG. 1 illustrates a simplified circuit diagram showing a cell array of a three-dimensional semiconductor memory device according to an example embodiment of the inventive concepts.

Referring to FIG. 1, a three-dimensional semiconductor memory device according to an example embodiment of the inventive concepts may include a cell array including a plurality of sub-cell arrays SCA. The sub-cell arrays SCA may be arranged along a second direction D2.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metal lines) spaced apart from and disposed on a substrate. The bit lines BL may extend in a first direction D1. The bit lines BL in one sub-cell array SCA may be spaced apart from each other in a vertical direction (e.g., a third direction D3).

The word lines WL may be conductive patterns (e.g., metal lines) that extend in the vertical direction (e.g., the third direction D3) from the substrate. The word lines WL in one sub-cell array SCA may be spaced apart from each other in the first direction D1.

A gate of the memory cell transistor MCT may be connected to the word line WL, and a source of the memory cell transistor MCT may be connected to the bit line BL. Each of the memory cell transistors MCT may include a data storage element DS. For example, the data storage element DS may be a capacitor, and a drain of the memory cell transistor MCT may be connected to the capacitor.

Figure 2:
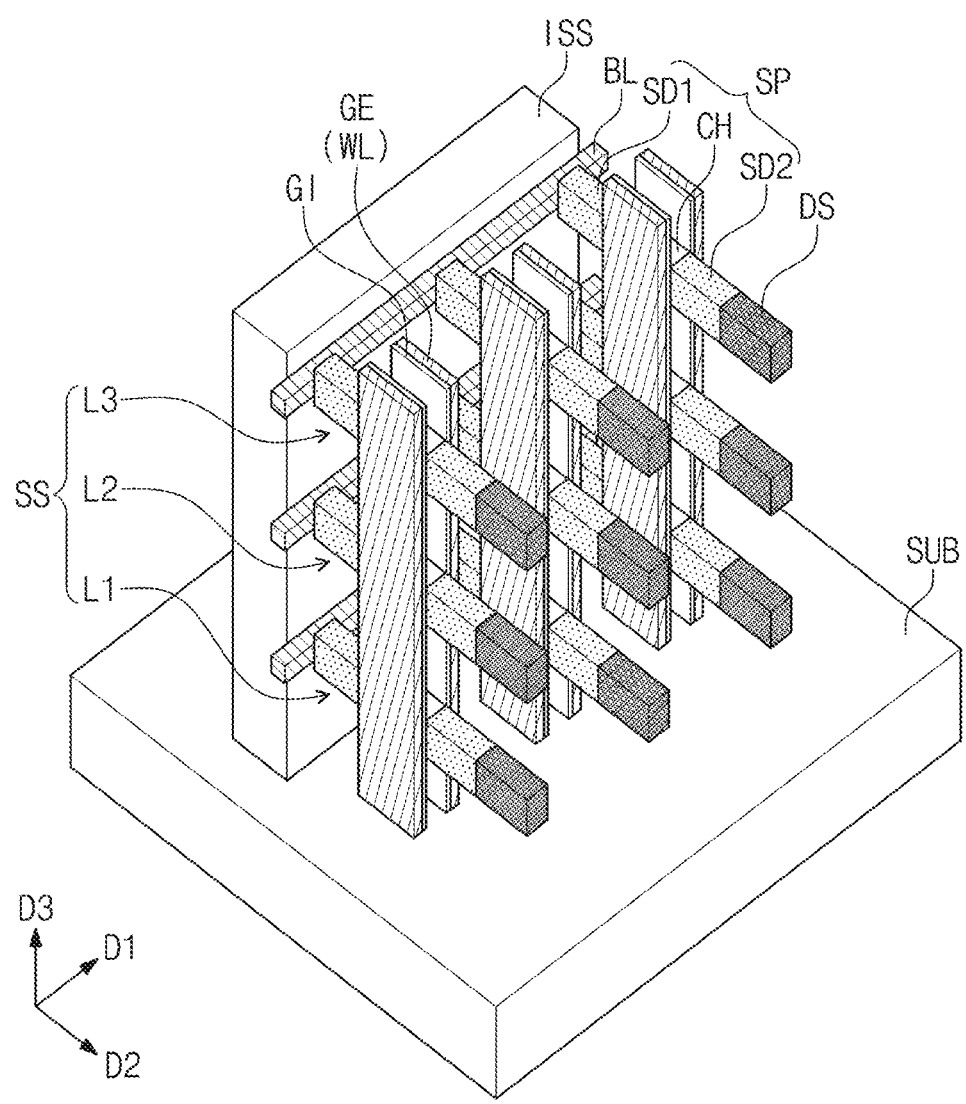
FIG. 2 illustrates a perspective view showing a three-dimensional semiconductor memory device according to an example embodiment of the inventive concepts.

FIG. 2 illustrates a perspective view showing a three-dimensional semiconductor memory device according to an example embodiment of the inventive concepts.

Referring to FIGS. 1 and 2, a substrate SUB may be provided thereon with one of the plurality of sub-cell arrays SCA discussed with reference to FIG. 1. For example, the substrate SUB may be a silicon substrate, a germanium substrate, or a silicon-germanium substrate.

For example, the substrate SUB may be provided thereon with a stack structure SS including first, second, and third layers L1, L2, and L3. The first, second, and third layers L1, L2, and L3 of the stack structure SS may be spaced apart and stacked in a vertical direction (e.g., a third direction D3). Each of the first, second, and third layers L1, L2, and L3 may include a plurality of semiconductor patterns SP, a plurality of data storage elements DS, and a bit line BL.

Each of the semiconductor patterns SP may have one of linear, bar, or pillar shapes that extends in a second direction D2. The semiconductor patterns SP may include, for example, silicon, germanium, or silicon-germanium. Each of the semiconductor patterns SP may include a channel region CH, a first impurity region SD1, and a second impurity region SD2. The channel region CH may be interposed between the first and second impurity regions SD1 and SD2. The channel region CH may correspond to a channel of the memory cell transistor MCT discussed with reference to FIG. 1. The first and second impurity regions SD1 and SD2 may correspond to source and drain of the memory cell transistor MCT discussed with reference to FIG. 1.

The first and second impurity regions SD1 and SD2 may be areas in each of which the semiconductor pattern SP is doped with impurities. The first and second impurity regions SD1 and SD2 may have n-type or p-type conductivity, respectively.

The data storage elements DS may be connected to corresponding ends of the semiconductor patterns SP. The data storage elements DS may be correspondingly connected to the second impurity regions SD2 of the semiconductor patterns SP. The data storage elements DS may be memory elements capable of storing data. Each of the data storage elements DS may be a memory element using one of a capacitor, a magnetic tunnel junction pattern, or a variable resistance member that includes a phase change material. For example, each of the data storage elements DS may be a capacitor.

Each of the bit lines BL may have a linear or bar shape that extends in a first direction D1. The bit lines BL may be spaced apart from each other and stacked along the third direction D3. The bit lines BL may include a conductive material. For example, the conductive material may include one of a doped semiconductor material (e.g., doped silicon or doped germanium), a conductive metal nitride material (e.g., titanium nitride or tantalum nitride), a metallic material (e.g., tungsten, titanium, or tantalum), and a metal-semiconductor compound (e.g., tungsten silicide, cobalt silicide, or titanium silicide). The bit lines BL may correspond to the bit lines BL discussed with reference to FIG. 1.

Among the first, second, and third layers L1, L2, and L3, the first layer L1 will be representatively described in detail below. The semiconductor patterns SP of the first layer L1 may be spaced apart from each other in the first direction D1. The semiconductor patterns SP of the first layer L1 may be located at the same first level. The bit line BL of the first layer L1 may be connected to ends of the semiconductor patterns SP of the first layer L1. For example, the bit line BL may be directly connected to the first impurity regions SD1. For another example, the bit line BL may be electrically connected through metal silicide to the first impurity regions SD1. The above detailed description of the first layer L1 may also be identically or substantially similarly applicable to the second and third layers L2 and L3.

The substrate SUB may be provided thereon with gate electrodes GE that penetrate the stack structure SS. The gate electrodes GE may have linear or bar shapes that extend in the third direction D3. The gate electrodes GE may be arranged in the first direction D1. When viewed in plan, the semiconductor patterns SP may be stacked between a pair of gate electrodes GE. Each of the gate electrodes GE may vertically extend on sidewalls of a plurality of semiconductor patterns SP that are vertically stacked.

For example, a first pair of gate electrodes GE may be adjacent to a first one of the semiconductor patterns SP of the first layer L1, to a first one of the semiconductor patterns SP of the second layer L2, and to a first one of the semiconductor patterns SP of the third layer L3. A second pair of gate electrodes GE may be adjacent to a second one of the semiconductor patterns SP of the first layer L1, to a second one of the semiconductor patterns SP of the second layer L2, and to a second one of the semiconductor patterns SP of the third layer L3.

The gate electrode GE may be adjacent to the channel region CH of the semiconductor pattern SP. The gate electrode GE may be provided on a sidewall of the channel region CH and may extend in the third direction D3. A gate insulating layer GI may be interposed between the gate electrode GE and the channel region CH. The gate insulating layer GI may include a high-k dielectric layer, a silicon oxide layer, a silicon nitride layer, a silicon oxynitride layer, or a combination thereof. For example, the high-k dielectric layer may include one or more of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate.

The gate electrodes GE may include a conductive material, which conductive material may be one of a doped semiconductor material, a conductive metal nitride material, a metallic material, or a metal-semiconductor compound. The gate electrodes GE may correspond to the word lines WL discussed with reference to FIG. 1.

The substrate SUB may be provided thereon with an insulation structure ISS that extends in the first direction D1 along one lateral surface of the stack structure SS. The insulation structure ISS may include one or more of a silicon oxide layer, a silicon nitride layer, or a silicon oxynitride layer.

Although not shown, a dielectric material may fill empty spaces in the stack structure SS. For example, the dielectric material may include one or more of a silicon oxide layer, a silicon nitride layer, or a silicon oxynitride layer.

Figure 3:
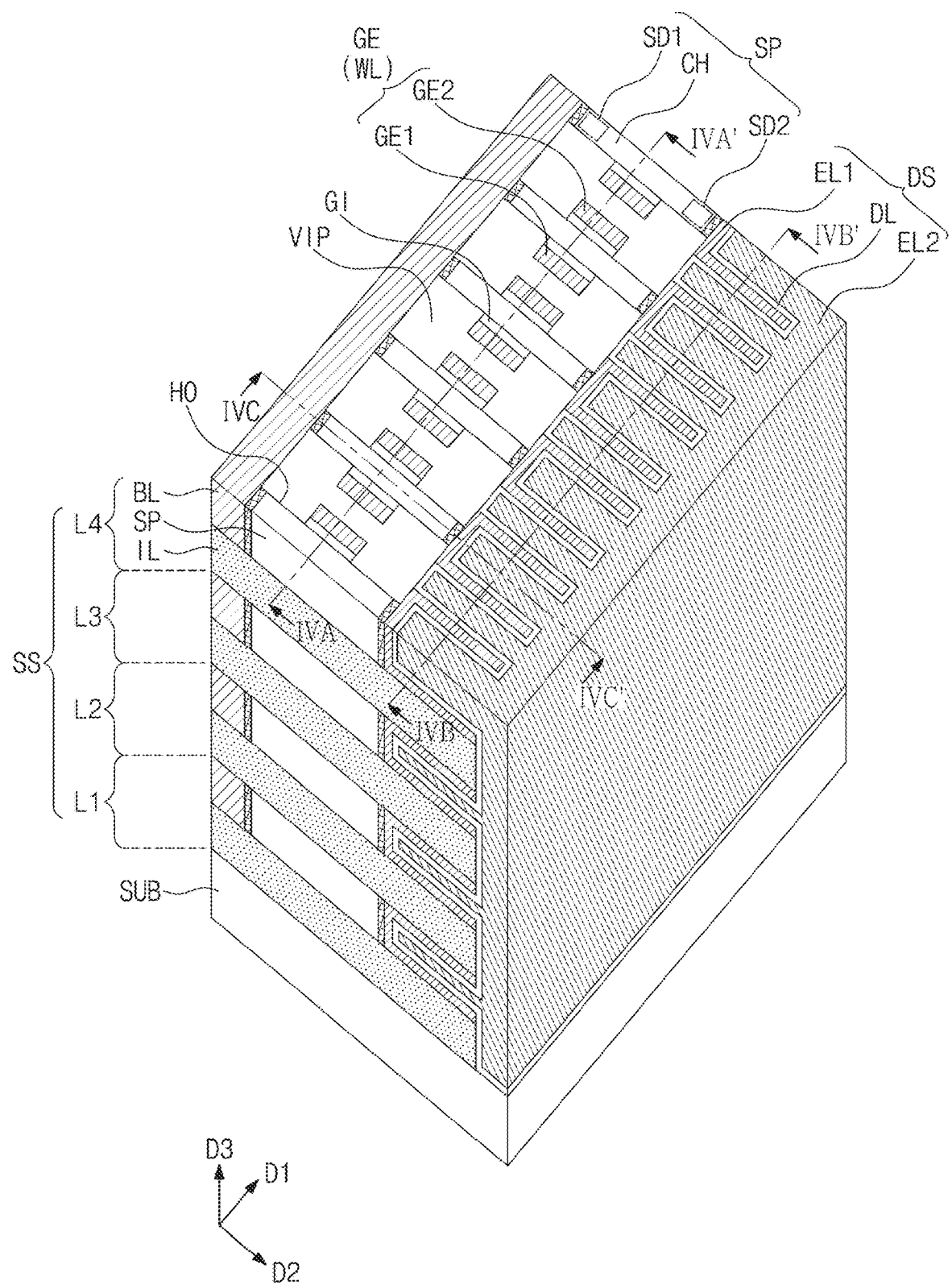
FIG. 3 illustrates a perspective view showing a three-dimensional semiconductor memory device according to an example embodiment of the inventive concepts.
Figure 4A:
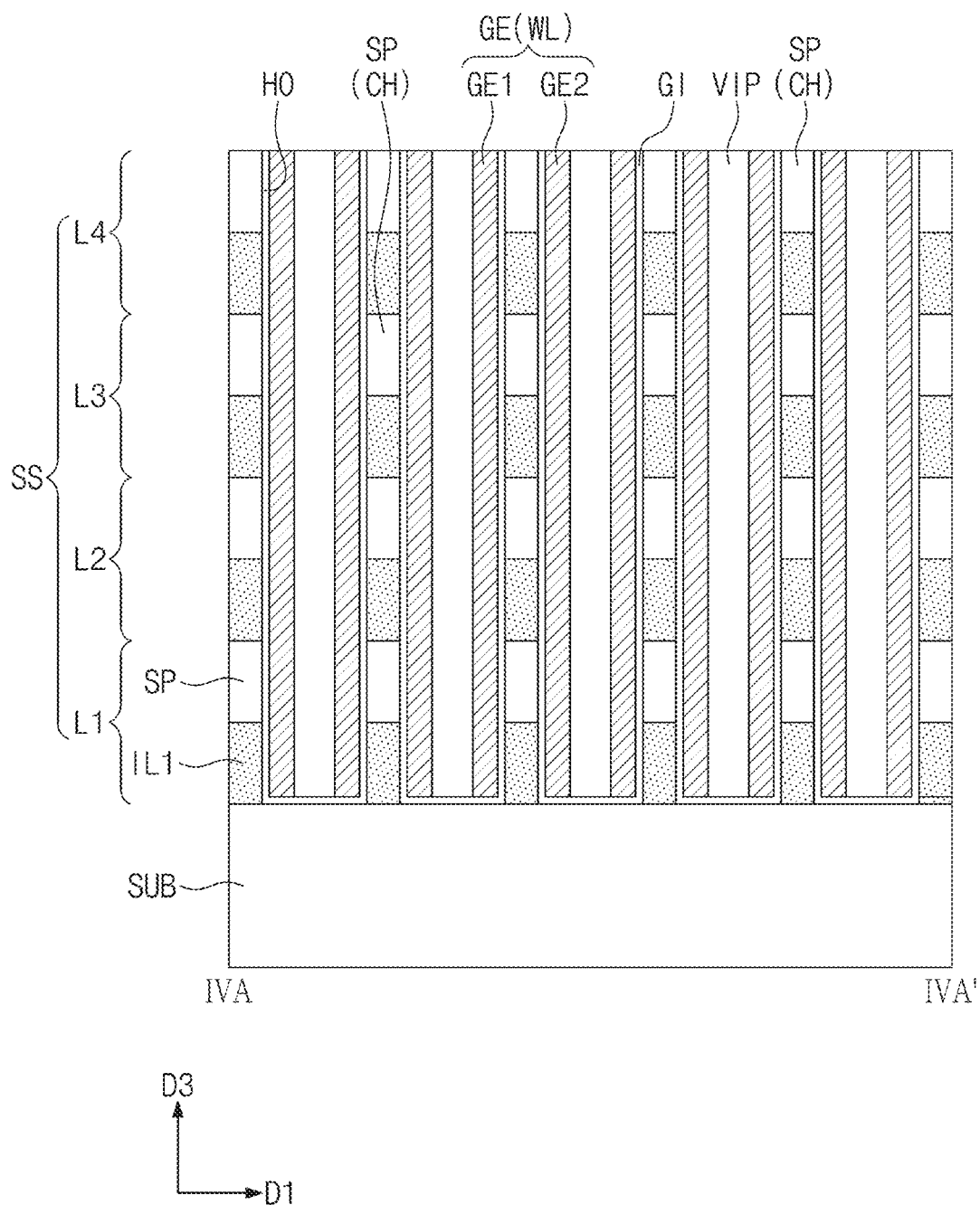
FIGS. 4A, 4B, and 4C illustrate cross-sectional views respectively taken along lines IVA-IVA', IVB-IVB', and IVC-IVC' of FIG. 3.
Figure 4B:
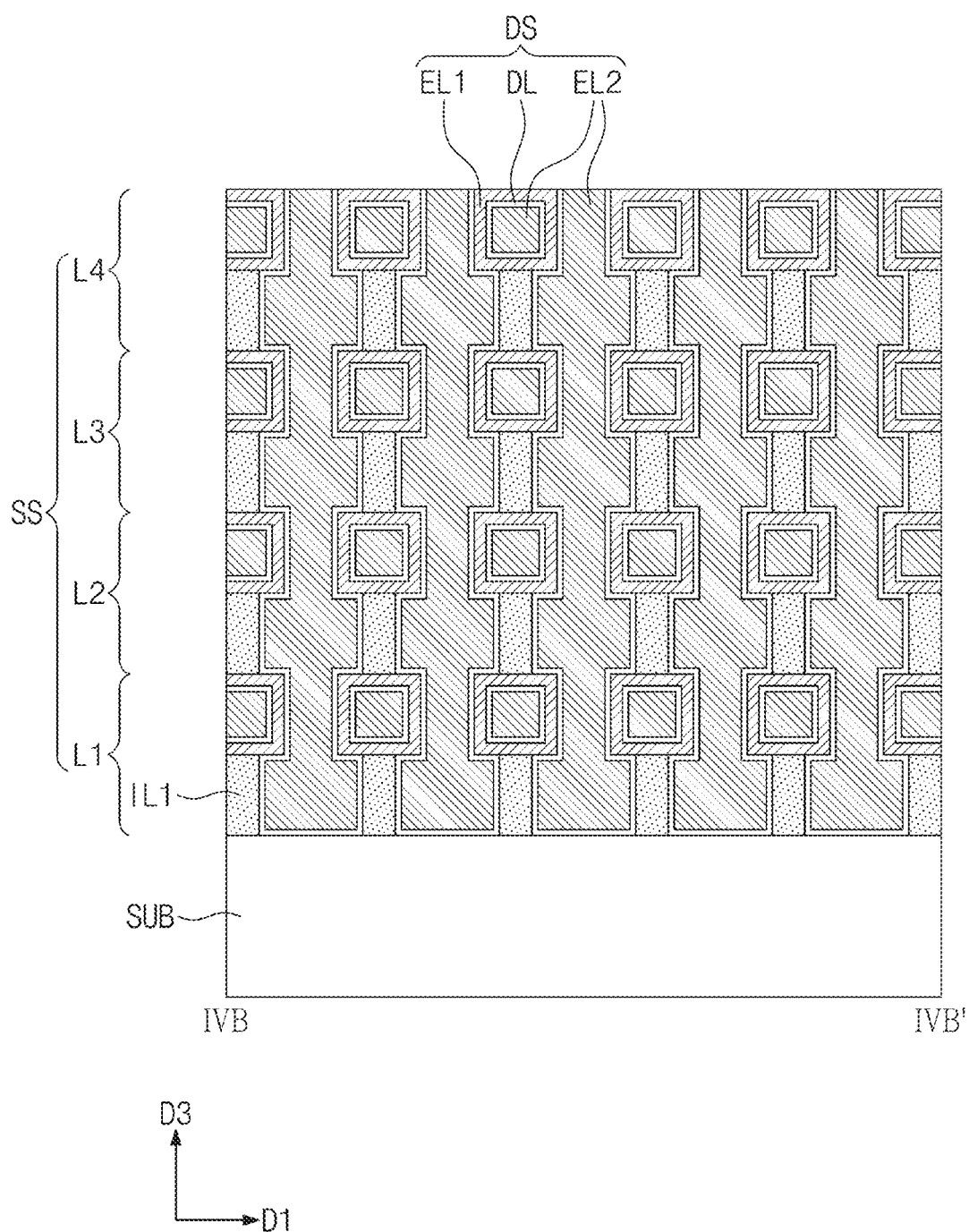
Figure 4C:
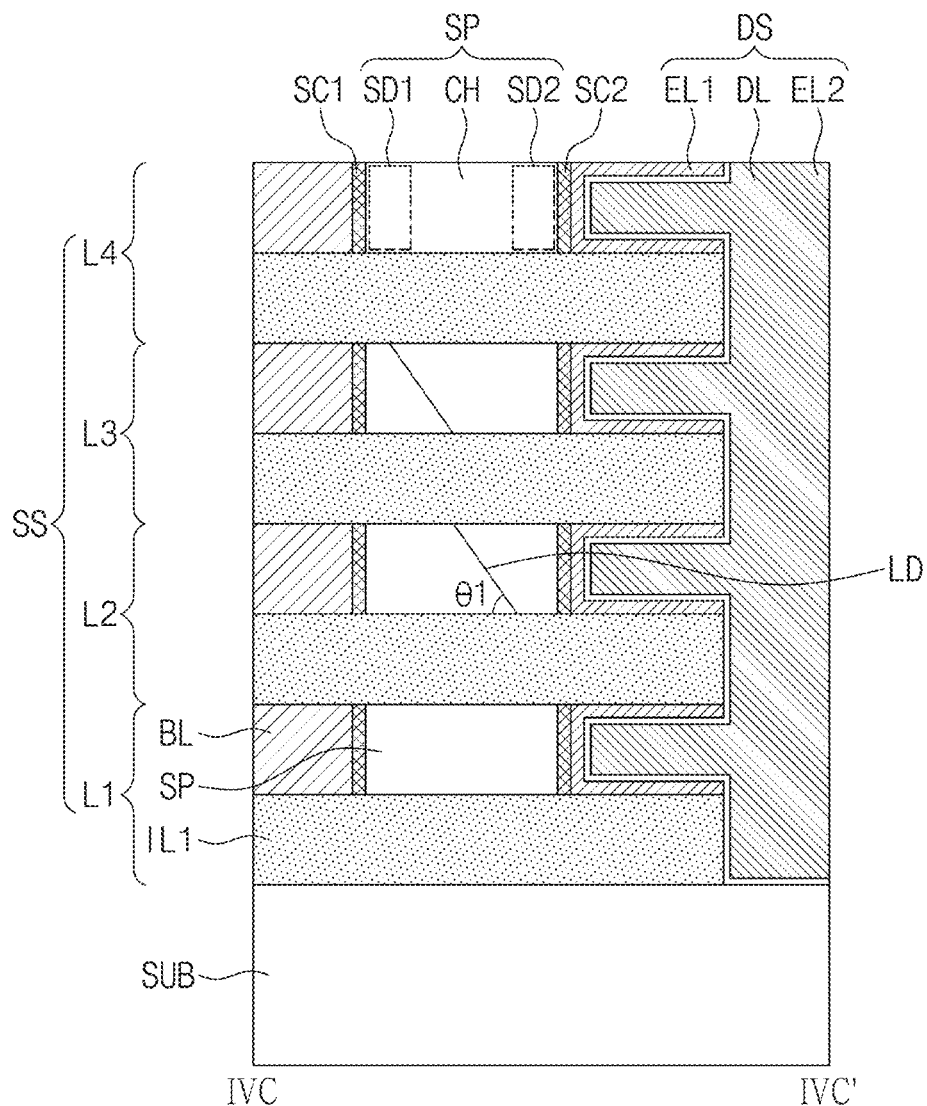

FIG. 3 illustrates a perspective view showing a three-dimensional semiconductor memory device according to an example embodiment of the inventive concepts. FIGS. 4A, 4B, and 4C illustrate cross-sectional views respectively taken along lines IVA-IVA', IVB-IVB', and IVC-IVC' of FIG. 3. In the following description, a detailed description of technical features repetitive to those discussed above with reference to FIGS. 1 and 2 will be omitted, and a difference thereof will be discussed in detail.

Referring to FIGS. 3 and 4A to 4C, a stack structure SS may be provided on a substrate SUB. The stack structure SS may extend in a first direction D1. Although not shown, the stack structure SS may be provided in plural, and the plurality of stack structures SS may be arranged in a second direction D2.

The stack structure SS may include first, second, third, and fourth layers L1, L2, L3, and L4 that are sequentially stacked on the substrate SUB. Each of the first, second, third, and fourth layers L1, L2, L3, and L4 may include a first insulating layer IL1 a semiconductor pattern SP, and a bit line BL. The first, second, third, and fourth layers L1, L2, L3, and L4 are examples according to an example embodiment of the inventive concepts, and one or more additional layers may be stacked on the fourth layer L4.

The semiconductor pattern SP and the bit line BL may be provided on the first insulating layer ILL The semiconductor pattern SP and the bit line BL may be disposed in parallel to each other on the first insulating layer ILL The first insulating layer IL1 may vertically (e.g., in a third direction D3) separate the semiconductor pattern SP on an upper layer from the semiconductor pattern SP on a lower layer. The first insulating layer IL1 may separate the bit line BL on an upper layer in the third direction D3 from the bit line BL on a lower layer.

The bit line BL of each of the first, second, third, and fourth layers L1, L2, L3, and L4 may extend in the first direction D1. The bit line BL may be located at the same level as that of the semiconductor pattern SP. One sidewall of the bit line BL may face one sidewall of the semiconductor pattern SP. One sidewall of the bit line BL may contact one sidewall of the semiconductor pattern SP.

The semiconductor pattern SP may include a semiconductor material, such as silicon, germanium, or silicon-germanium. For example, the semiconductor pattern SP may include single-crystalline silicon. At least one semiconductor pattern SP may have a lattice defect LD therein. The lattice defect LD may obliquely extend from a bottom surface of the semiconductor pattern SP toward a top surface of the semiconductor pattern SP. The lattice defect LD may be at an angle θ1 of 50° to 60° with respect to a top surface of the first insulating layer ILL For example, the angle θ1 may be about 54.7°.

The first insulating layer IL1 may include one selected from a silicon oxide layer, a silicon nitride layer, a silicon oxynitride layer, a carbon-containing silicon oxide layer, a carbon-containing silicon nitride layer, or a carbon-containing silicon oxynitride layer.

The semiconductor pattern SP of each of the first, second, third, and fourth layers L1, L2, L3, and L4 may be provided in plural. Each of the plurality of semiconductor patterns SP of each of the first, second, third, and fourth layers L1, L2, L3, and L4 may have a bar shape that extends in a second direction D2 from the bit line BL. Each of the semiconductor patterns SP may include a channel region CH, a first impurity region SD1, and a second impurity region SD2. The channel region CH may be interposed between the first and second impurity regions SD1 and SD2. The bit line BL may be electrically connected to the first impurity region SD1 of the semiconductor pattern SP.

Holes HO may be defined to penetrate the stack structure SS. The hole HO may be positioned between a pair of neighboring semiconductor patterns SP. Gate electrodes GE may extend in a vertical direction (e.g., the third direction D3) in the hole HO that penetrates the stack structure SS. For example, the gate electrodes GE may penetrate the stack structure SS.

The gate electrodes GE may include a first gate electrode GE1 and a second gate electrode GE2 on opposite sides of the channel region CH of the semiconductor pattern SP. For example, the first and second gate electrodes GE1 and GE2 may constitute a single word line WL. For another example, the first gate electrode GE1 may be a word line WL, and the second gate electrode GE2 may be a back gate.

A gate insulating layer GI may be interposed between each of the gate electrodes GE and each of the semiconductor patterns SP. The gate insulating layer GI may include a high-k dielectric layer, a silicon oxide layer, a silicon nitride layer, a silicon oxynitride layer, or a combination thereof.

A vertical insulating layer VIP may be provided to fill the hole HO. The vertical insulating layer VIP may cover the gate electrodes GE. For example, the vertical insulating layer VIP may be interposed between a pair of gate electrodes GE that face each other in the hole HO. The vertical insulating layer VIP may be interposed between a pair of neighboring semiconductor patterns SP. The vertical insulating layer VIP may include one or more of a silicon oxide layer, a silicon nitride layer, or a silicon oxynitride layer.

Data storage elements DS may be provided to have electrical connection with corresponding semiconductor patterns SP. Each of the data storage elements DS may include a first electrode EL1, a dielectric layer DL, and a second electrode EL2. The data storage elements DS in the stack structure SS may share one dielectric layer DL and one second electrode EL2. For example, a plurality of first electrodes EL1 may be provided in the stack structure SS, and one dielectric layer DL may cover surfaces of the first electrodes EL1. One second electrode EL2 may be provided on one dielectric layer DL. Each of the first electrodes EL1 may have a cylindrical shape whose one end is opened. The second electrode EL2 may fill a cylindrical inside of the first electrode EL1.

Each of the first and second electrodes EL1 and EL2 may include one or more of a metallic material (e.g., titanium, tantalum, tungsten, copper, or aluminum), a conductive metal nitride material (e.g., titanium nitride or tantalum nitride), and a doped semiconductor material (e.g., doped silicon or doped germanium). The dielectric layer DL may include a high-k dielectric material (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or a combination thereof).

A first silicide pattern SC1 may be interposed between the bit line BL and the semiconductor pattern SP. A second silicide pattern SC2 may be interposed between the semiconductor pattern SP and the first electrode EL1. The bit line BL may be electrically connected to the first impurity region SD1 through the first silicide pattern SC1. The first electrode EL1 may be electrically connected to the second impurity region SD2 through the second silicide pattern SC2. The first and second silicide patterns SC1 and SC2 may include metal silicide (e.g., cobalt silicide).

FIGS. 5A, 6A, 7A, 8A, 9A, and 10A illustrate plan views showing a method for forming a stack structure according to an example embodiment of the inventive concepts. FIGS. 5B, 6B, 7B, 8B, 9B, and 10B illustrate cross-sectional views taken along line V-V' of FIG. 5A, line VI-VI' of FIG. 6A, line VII-VII' of FIG. 7A, line VIII-VIII' of FIG. 8A, line IX-IX' of FIG. 9A, and line X-X' of FIG. 10A, respectively.

Figure 5A:
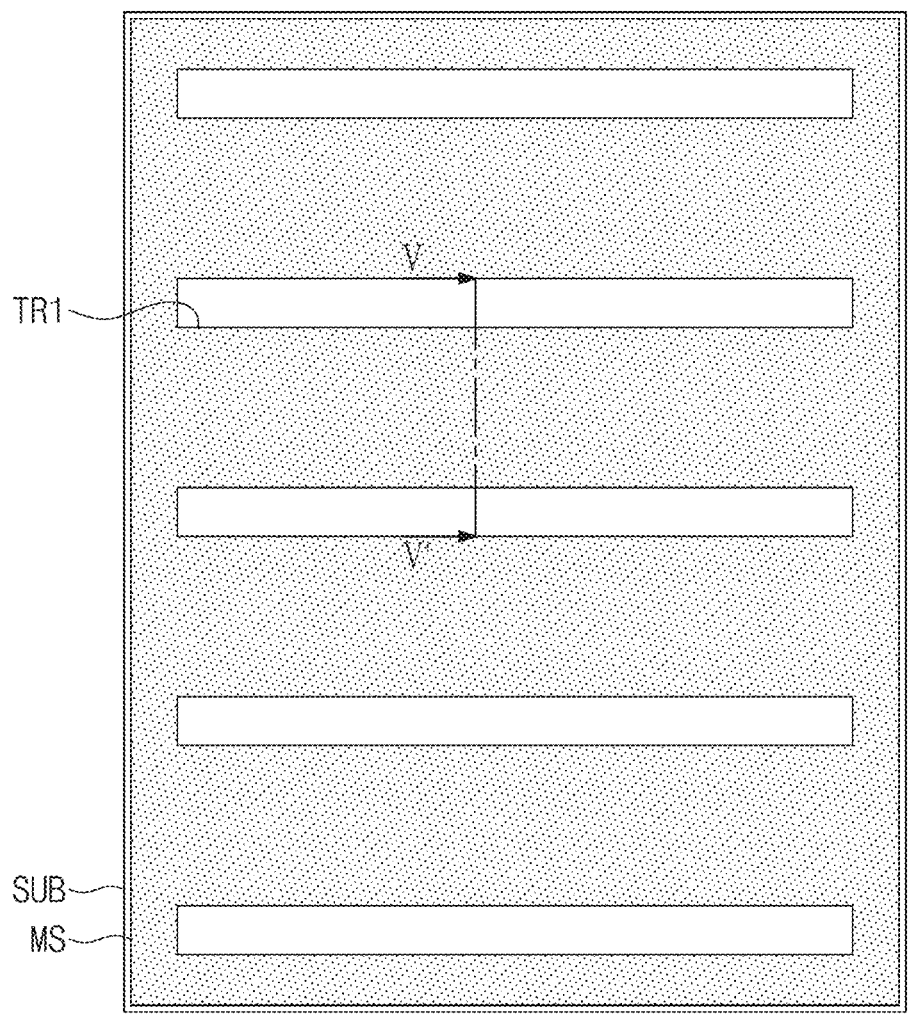
FIGS. 5A, 6A, 7A, 8A, 9A, and 10A illustrate plan views showing a method for forming a stack structure according to an example embodiment of the inventive concepts.
Figure 5B:
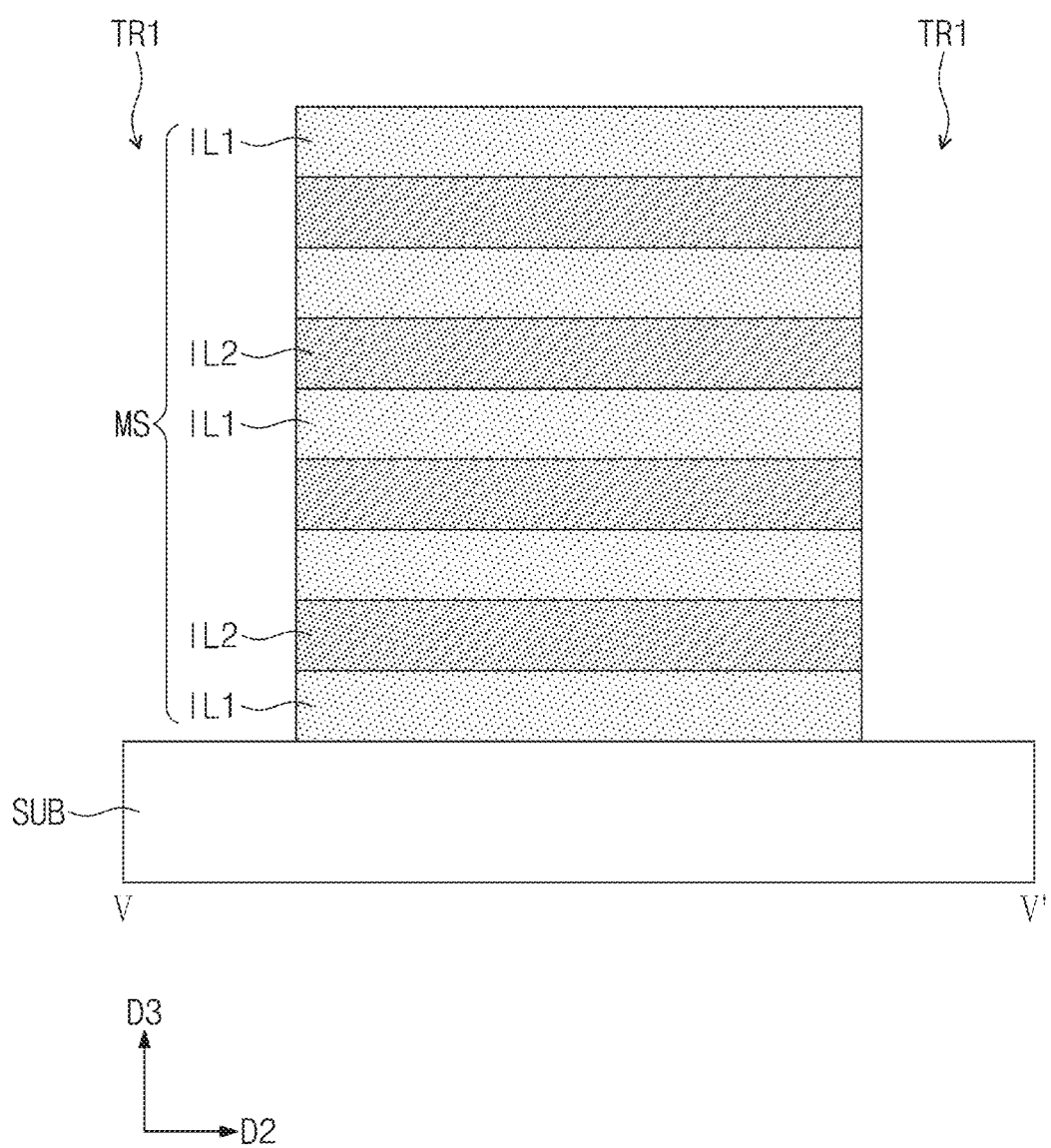
FIGS. 5B, 6B, 7B, 8B, 9B, and 10B illustrate cross-sectional views taken along line V-V' of FIG. 5A, line VI-VI' of FIG. 6A, line VII-VII' of FIG. 7A, line VIII-VIII' of FIG. 8A, line IX-IX' of FIG. 9A, and line X-X' of FIG. 10A, respectively.

Referring to FIGS. 5A and 5B, a mold structure MS may be formed on a substrate SUB. The formation of the mold structure MS may include alternately stacking first insulating layers IL1 and second insulating layers IL2 on the substrate SUB.

The first and second insulating layers IL1 and IL2 may include one of a silicon oxide layer, a silicon nitride layer, a silicon oxynitride layer, a carbon-containing silicon oxide layer, a carbon-containing silicon nitride layer, or a carbon-containing silicon oxynitride layer. The first and second insulating layers IL1 and IL2 may have an etch selectivity with respect to each other. For example, the first insulating layers IL1 may be formed of a silicon oxide layer (e.g., SiO), and the second insulating layers IL2 may be formed of a silicon nitride layer (e.g., SiN).

The mold structure MS may be patterned to form first trenches TR1. The first trenches TR1 may extend in a first direction D1. The first trenches TR1 may be arranged in a second direction D2 at a regular pitch. The first trenches TR1 may expose a top surface of the substrate SUB.

Figure 6A:
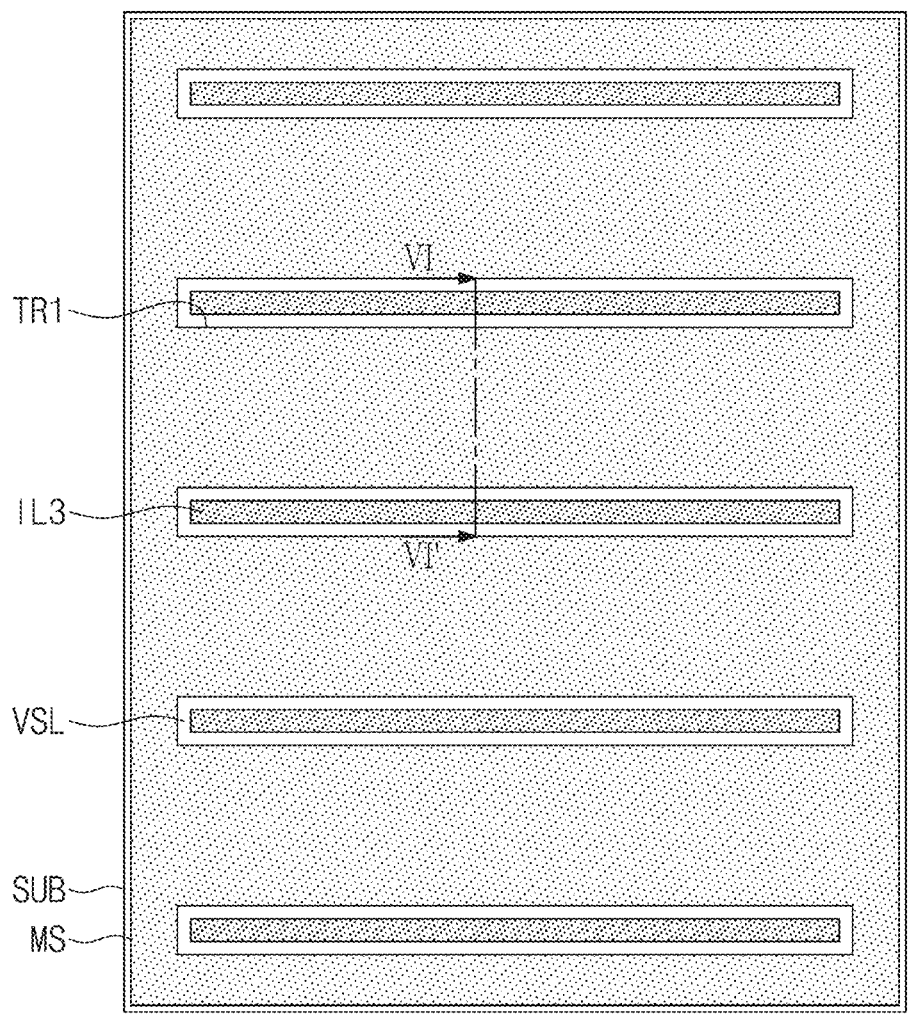
Figure 6B:
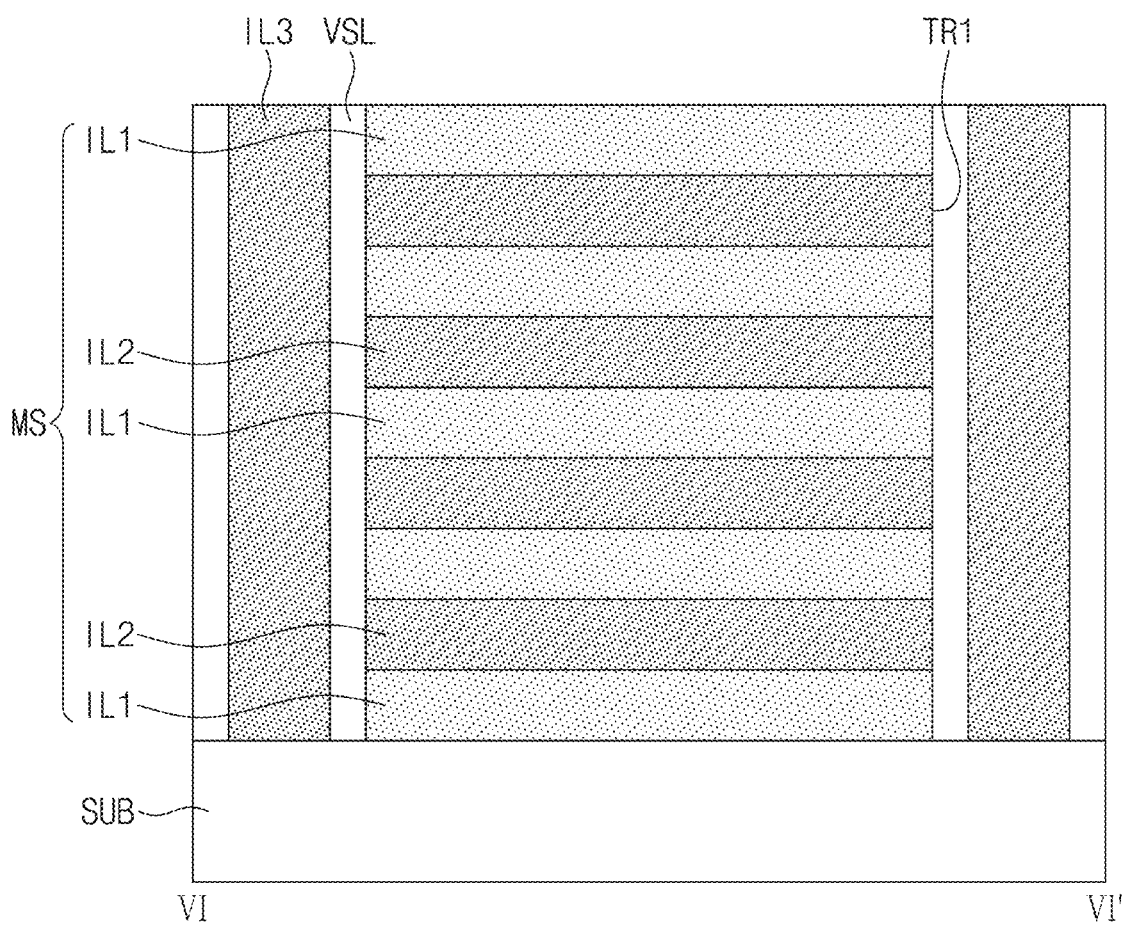

Referring to FIGS. 6A and 6B, a vertical semiconductor layer VSL and a third insulating layer IL3 may fill each of the first trenches TR1. For example, a spacer may cover an inner wall of the first trench TR1. On the spacer, the third insulating layer IL3 may completely fill the first trench TR1. The spacer may be selectively removed, and then the vertical semiconductor layer VSL may be formed in a space where the spacer is removed.

The vertical semiconductor layer VSL may be formed by a selective epitaxial growth process using the top surface of the substrate SUB as a seed. The vertical semiconductor layer VSL may be grown single-crystalline along a crystal-line structure of the substrate SUB. For example, the vertical semiconductor layer VSL may be a single-crystalline silicon layer. The first trench TR1 may expose an inner wall of the mold structure MS, and the vertical semiconductor layer VSL may cover the inner wall of the mold structure MS.

Figure 7A:
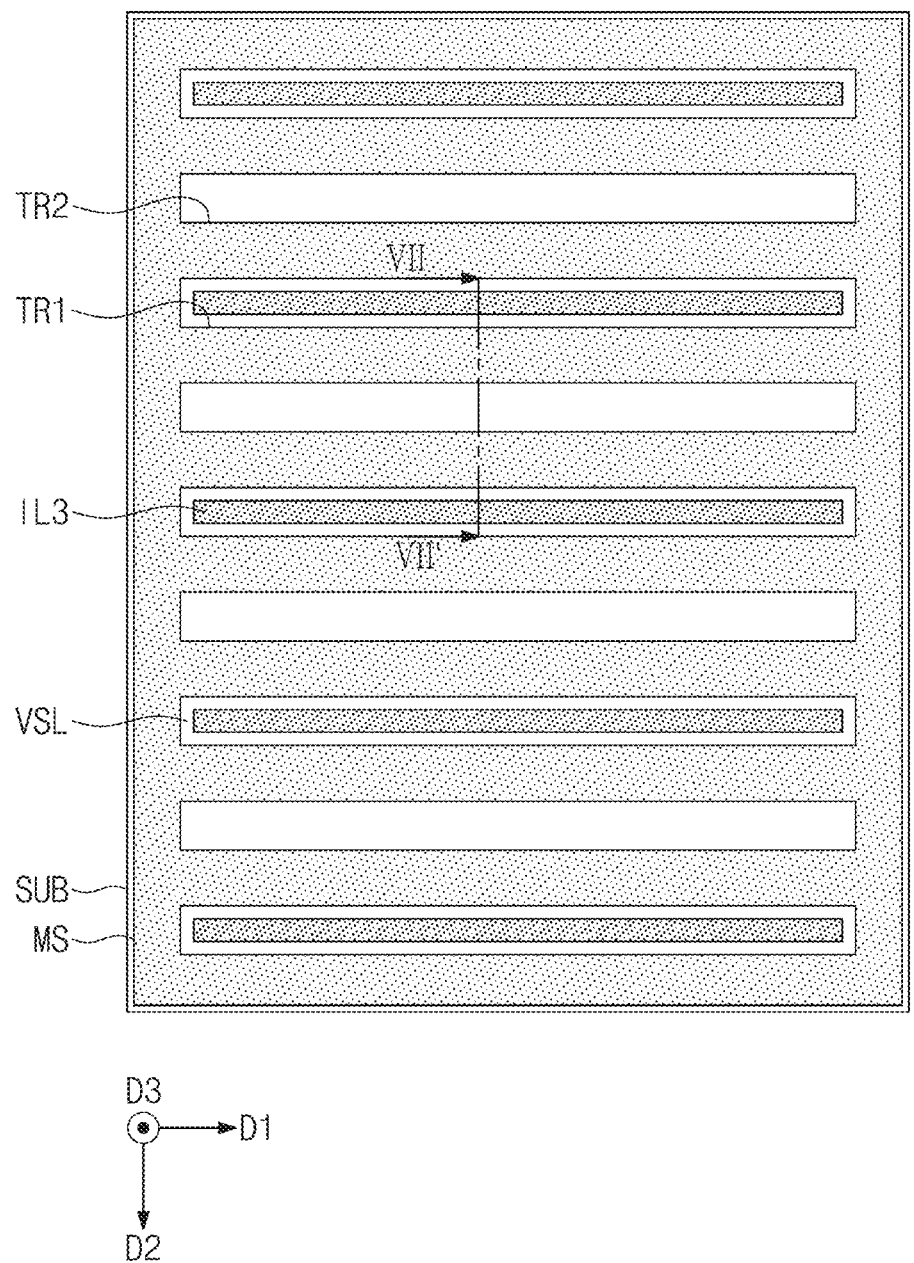
Figure 7B:
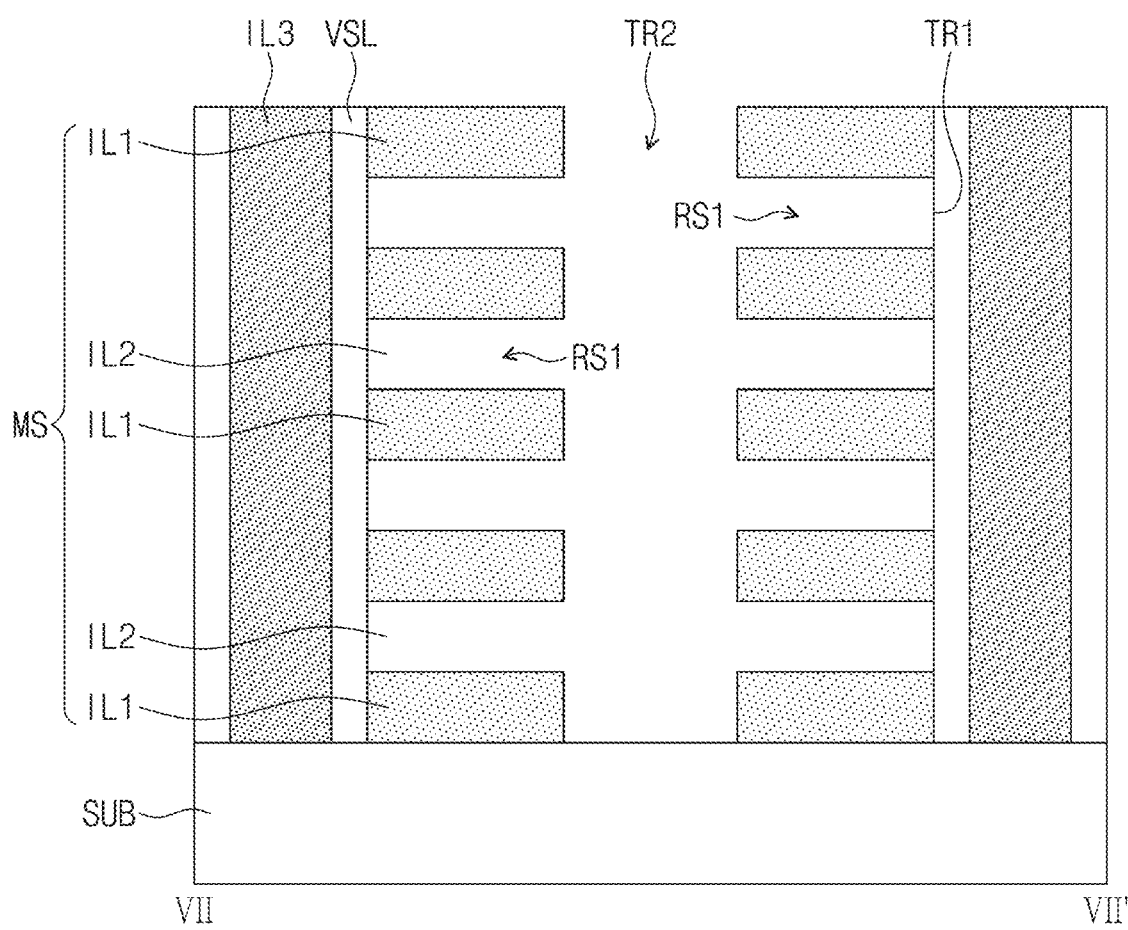

Referring to FIGS. 7A and 7B, the mold structure MS may be patterned to form a second trench TR2 between neighboring first trenches TR1. The second trench TR2 may extend in the first direction D1 parallel to the first trench TR1. A plurality of second trenches TR2 may be arranged in the second direction D2 at a regular pitch. For example, the pitch between the second trenches TR2 may be the same as or substantially similar to the pitch of the first pitch between the first trenches TR1.

The second trench TR2 may expose other inner wall of the mold structure MS. The second trench TR2 may expose the second insulating layers IL2 of the mold structure MS, and the second insulating layers IL2 may be selectively removed. The removal of the second insulating layers IL2 may include performing a wet etching process that selectively etches the second insulating layers IL2. A first recess RS1 may be defined at a space where the second insulating layer IL2 is removed. The first recess RS1 may exposed the vertical semiconductor layer VSL.

Figure 8A:
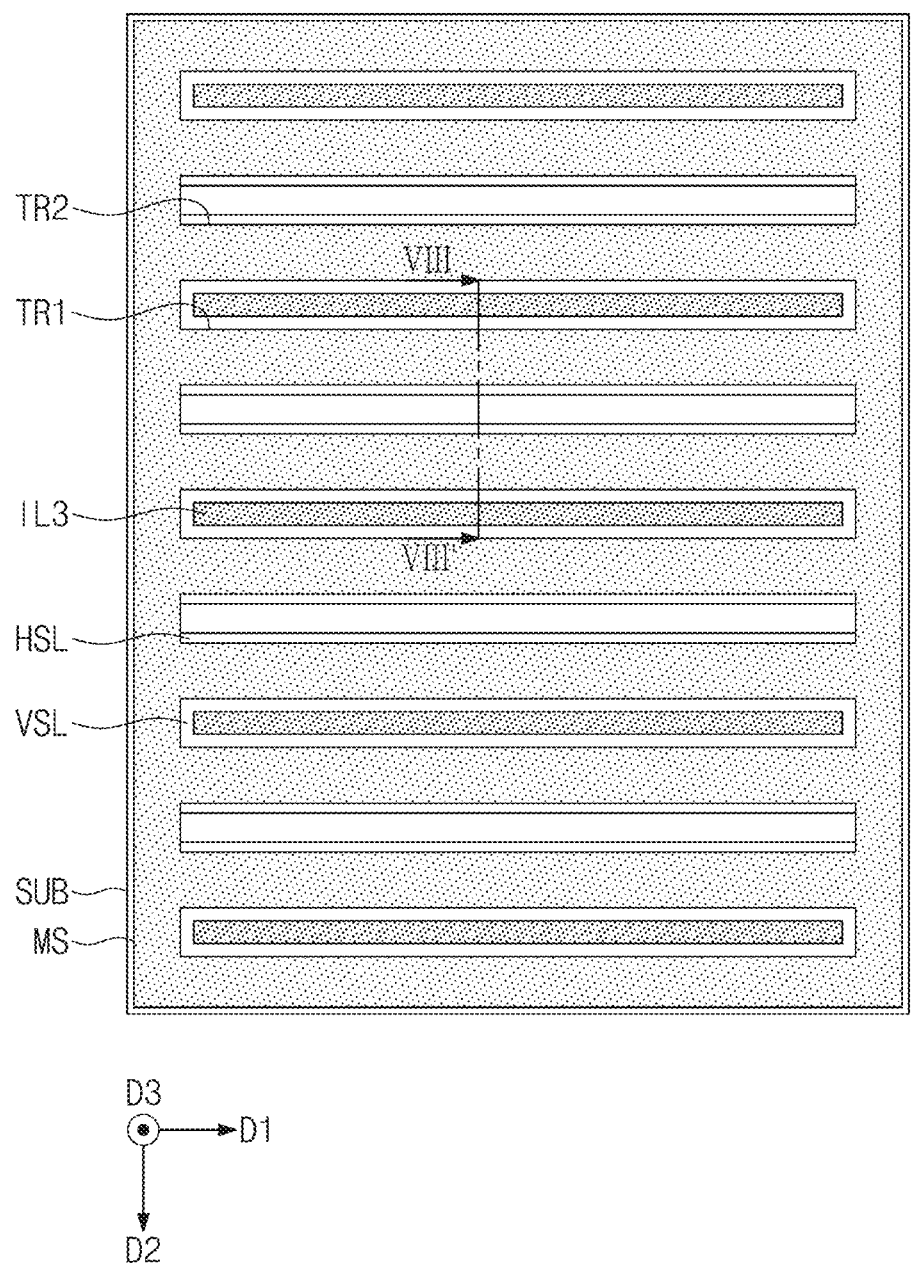
Figure 8B:
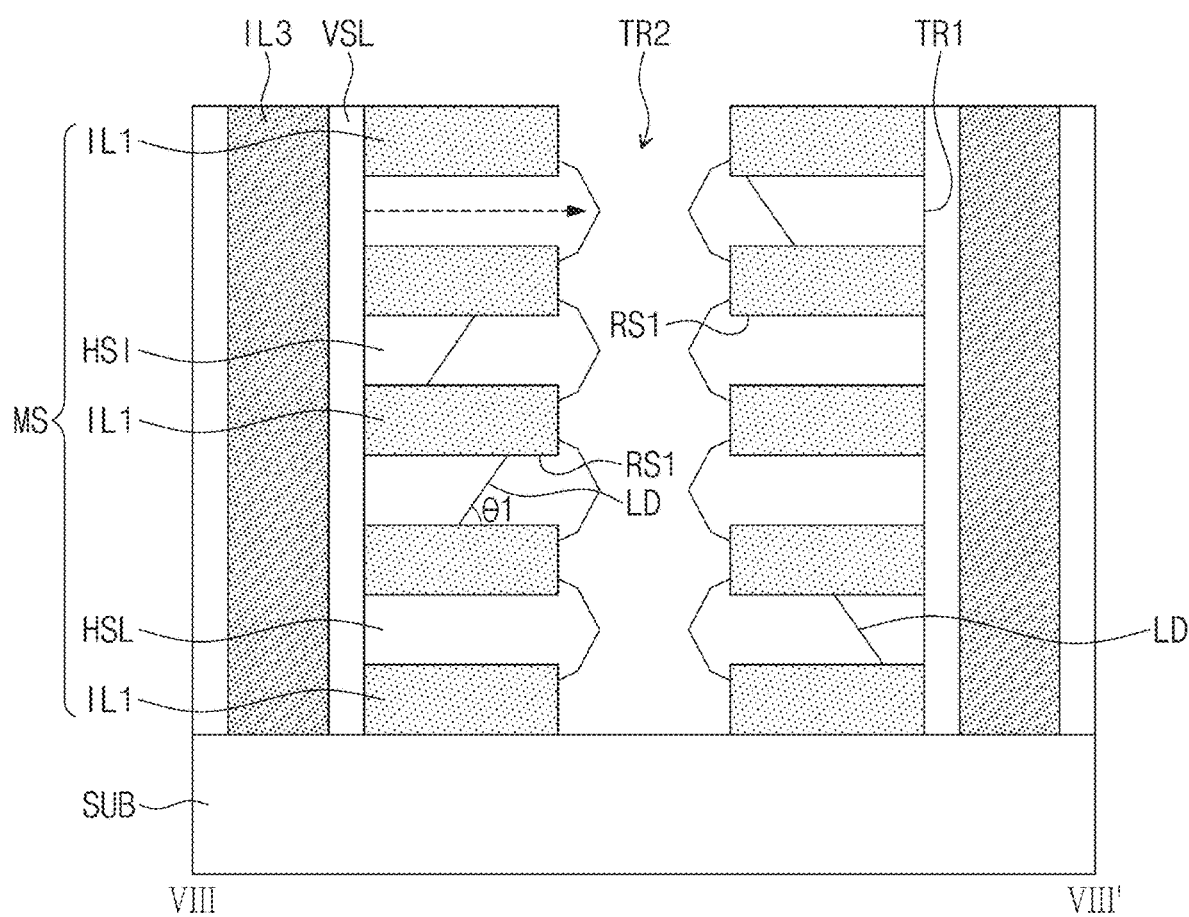

Referring to FIGS. 8A and 8B, a horizontal semiconductor layer HSL may fill each of the first recesses RS1. The formation of the horizontal semiconductor layer HSL may include performing a selective epitaxial growth process in which the vertical semiconductor layer VSL is used as a seed. The horizontal semiconductor layer HSL may be grown in the second direction D2 from the vertical semiconductor layer VSL. The selective epitaxial growth process may continue until the horizontal semiconductor layer HSL completely fills the first recess RS1.

The horizontal semiconductor layer HSL may be grown single-crystalline along a crystal structure of the vertical semiconductor layer VSL. For example, the horizontal semiconductor layer HSL may be a single-crystalline silicon layer. The horizontal semiconductor layer HSL may be sandwiched between its overlying and underlying first insulating layers IL1.

When the horizontal semiconductor layer HSL is selectively epitaxially grown while filling the first recess RS1, the horizontal semiconductor layer HSL may have a lattice defect LD that occurs due to a difference in crystal structure between the horizontal semiconductor layer HSL and the first insulating layers IL1. For example, at least one of the horizontal semiconductor layer HSL may include the lattice defect LD. The lattice defect LD may obliquely extend from bottom toward top surfaces of the horizontal semiconductor layer HSL. The lattice defect LD may be at an angle $\theta 1$ of 50° to 60° with respect to a top surface of the first insulating layer IL1. For example, the angle $\theta 1$ may be about 54.7°.

Figure 9A:
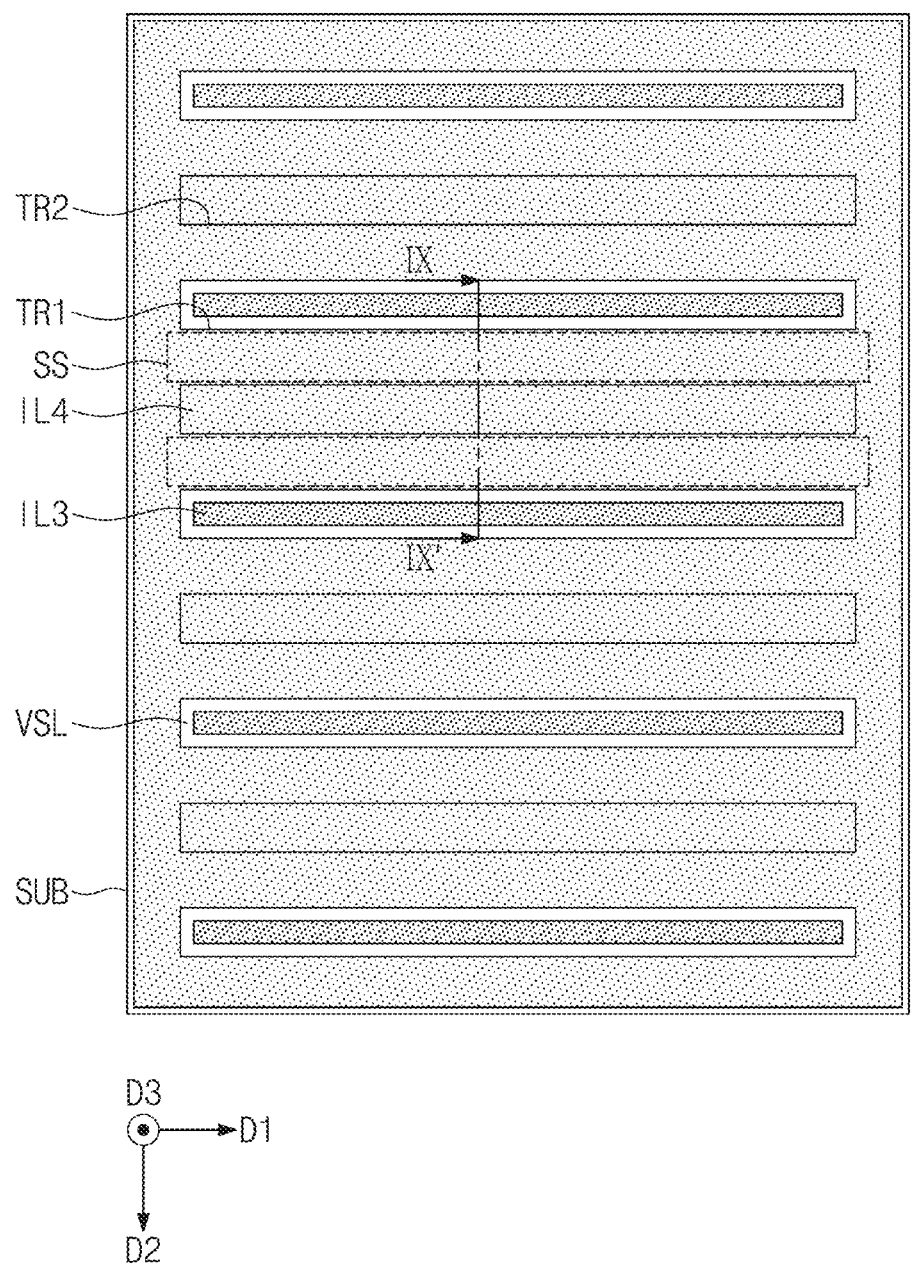
Figure 9B:
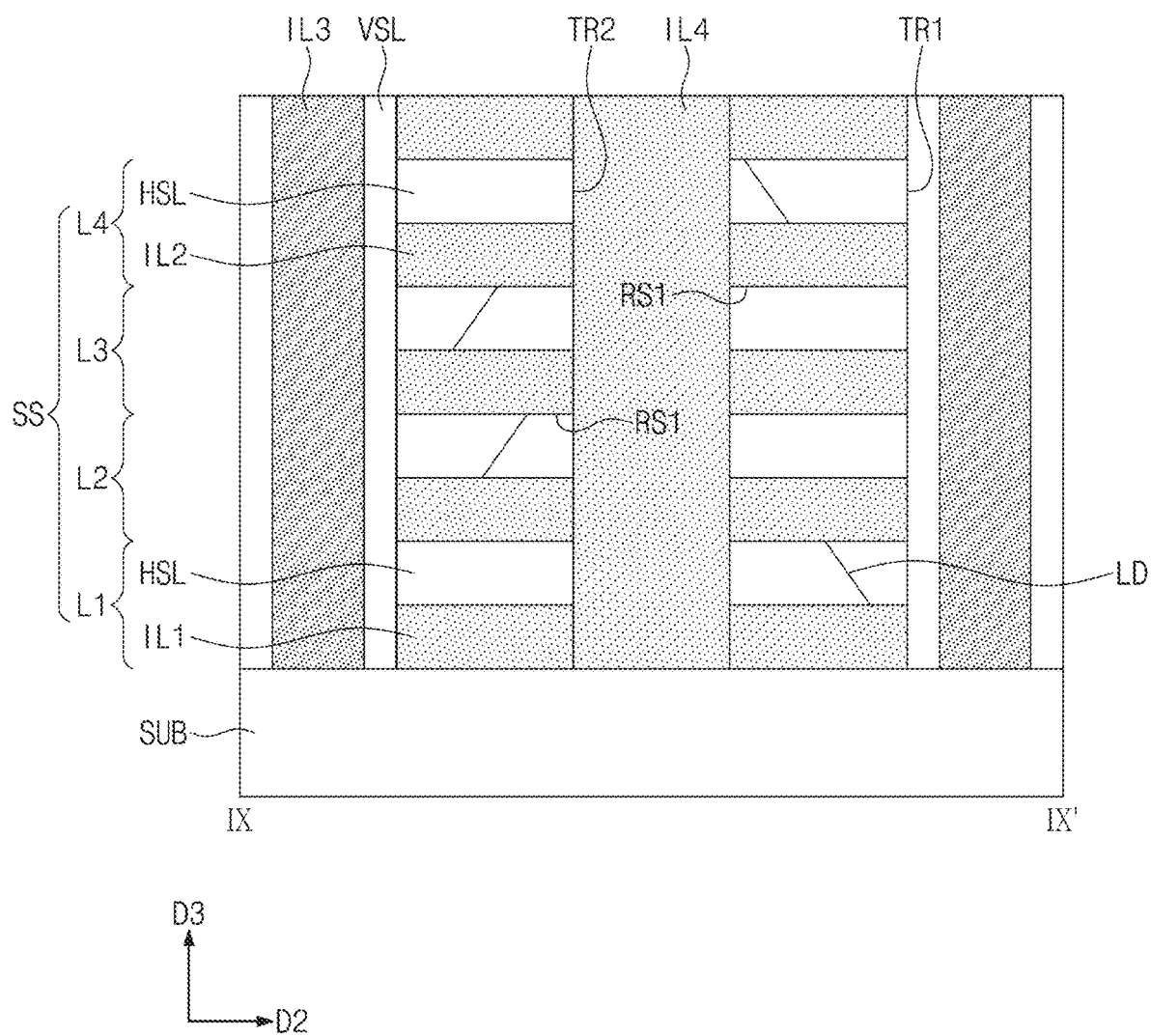

Referring to FIGS. 9A and 9B, a sacrificial layer (e.g., a polysilicon layer) may partially fill the second trench TR2, and then a silicon trimming process may be performed to remove an overgrown horizontal semiconductor layer HSL. Therefore, a stack structure SS may be provided in which the first insulating layers IL1 are alternately stacked with the horizontal semiconductor layers HSL.

The stack structure SS may be interposed between the first trench TR1 and the second trench TR2. The stack structure SS may extend in the first direction D1. A plurality of stack structures SS may be arranged along the second direction D2 at a regular pitch. For example, the stack structure SS may include first to fourth layers L1 to L4. Each of the first to fourth layers L1 to L4 may include the first insulating layer IL1 and the horizontal semiconductor layer HSL. The lattice defect LD may be included in at least one of the horizontal semiconductor layers HSL of the stack structure SS.

Subsequently, a fourth insulating layer IL4 may fill the second trench TR2. The fourth insulating layer IL4 may be interposed between the stack structures SS that neighbor each other in the second direction D2.

Figure 10A:
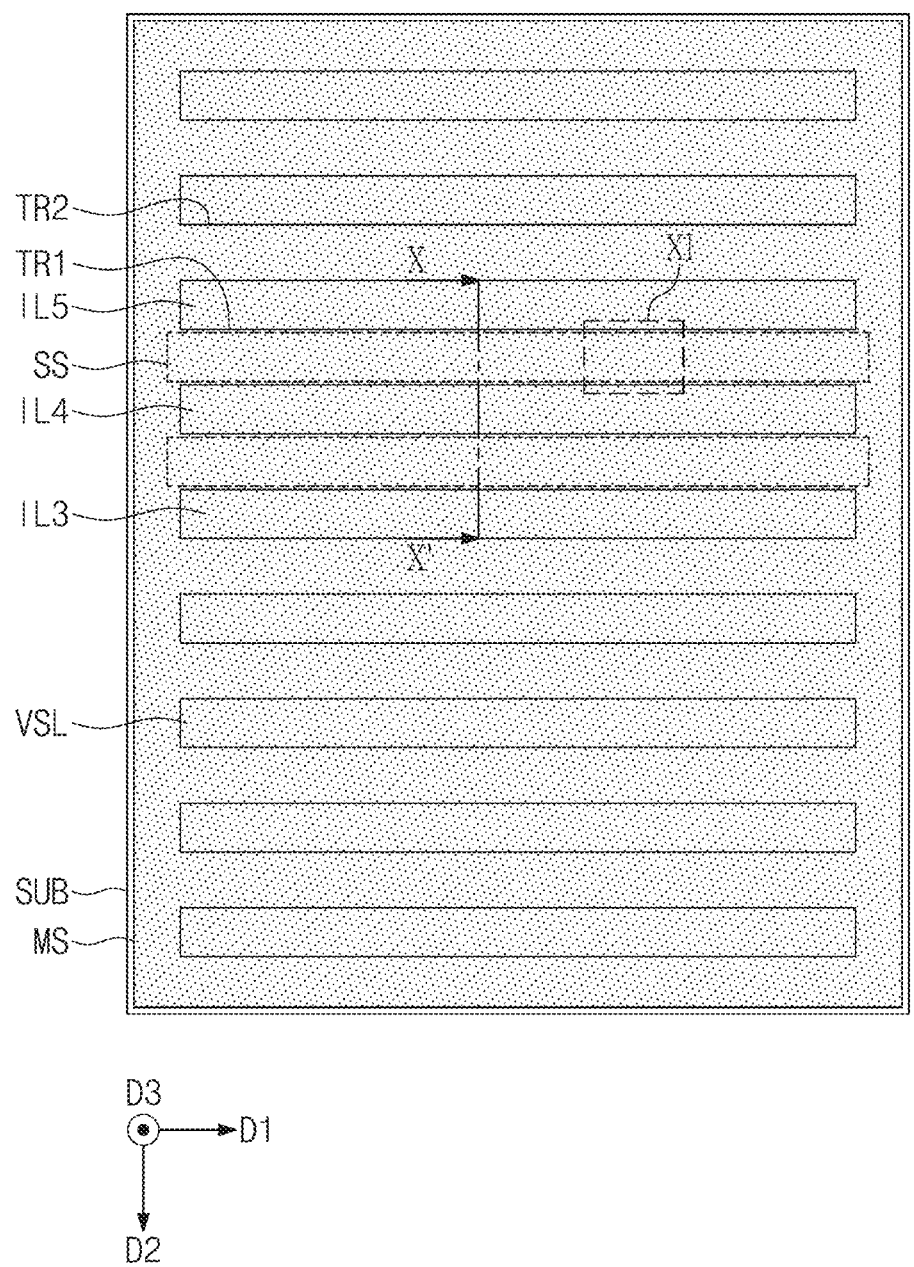
Figure 10B:
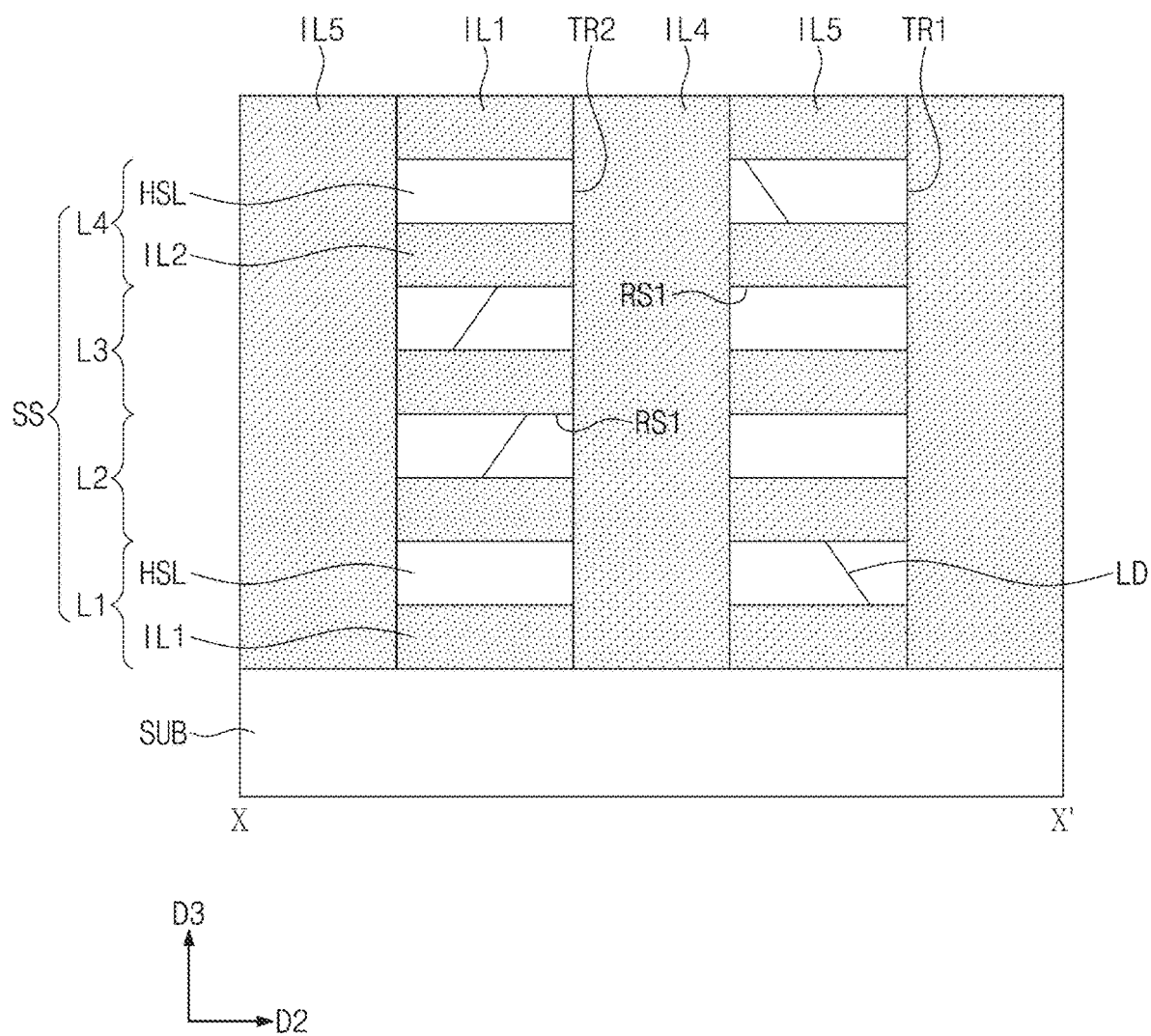

Referring to FIGS. 10A and 10B, the third insulating layer IL3 may be selectively removed from the first trench TR1. After the removal of the third insulating layer IL3, the vertical semiconductor layer VSL may be selectively removed. The removal of the vertical semiconductor layer VSL may include performing a silicon trimming process. Thereafter, a fifth insulating layer IL5 may be formed to fill the first trench TR1.

FIGS. 11, 13, 15, 17, 19, 21, and 23 illustrate plan views showing a method of fabricating a three-dimensional semiconductor memory device according to an example embodiment of the inventive concepts. FIGS. 12A, 14A, 16A, 18A, 20A, 22A, and 24A illustrate cross-sectional views taken along line XIIA-XIIA' of FIG. 11, line XIVA-XIVA' of FIG. 13, line XVIA-XVIA' of FIG. 15, line XVIIIA-XVIIIA' of FIG. 17, line XXA-XXA' of FIG. 19, line XXIIA-XXIIA' of FIG. 21, and line XXIVA-XXIVA' of FIG. 23, respectively. FIGS. 12B, 14B, 16B, 18B, 20B, 22B, and 24B illustrate cross-sectional views taken along line XIIB-XIIB' of FIG. 11, line XIVB-XIVB' of FIG. 13, line XVIB-XVIB' of FIG. 15, line XVIIIB-XVIIIB' of FIG. 17, line XXB-XXB' of FIG. 19, line XXIIB-XXIIB' of FIG. 21, and line XXIVB-XXIVB' of FIG. 23, respectively. FIGS. 11, 13, 15, 17, 19, 21, and 23 illustrate enlarged plan views of section XI depicted in FIG. 10A.

Figure 11:
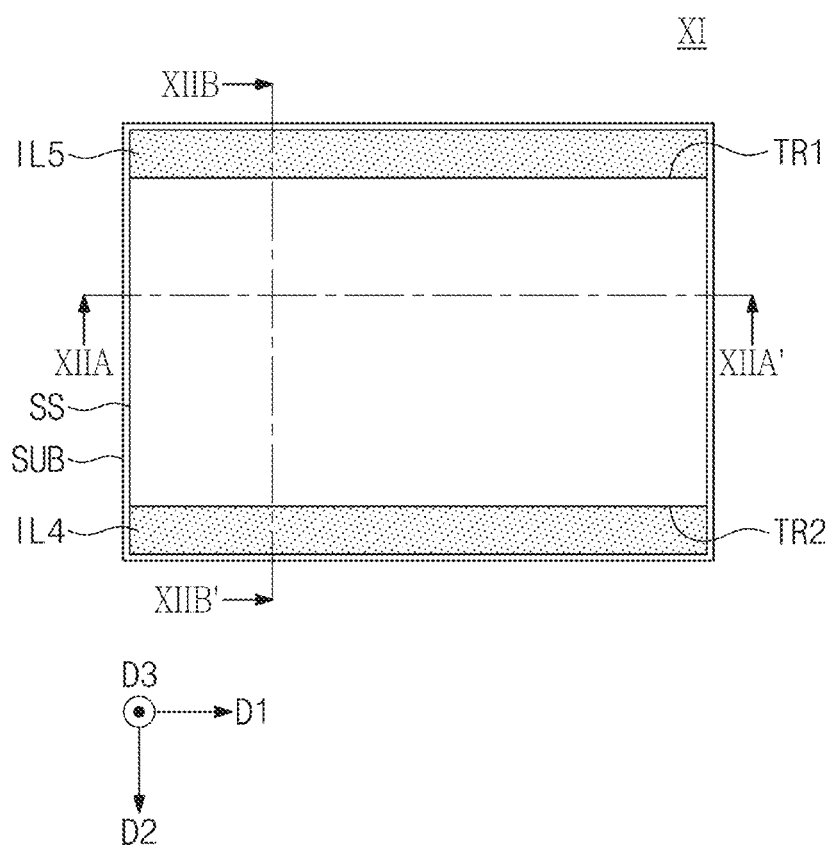
FIGS. 11, 11, 13, 15, 17, 19, 21, and 23 illustrate plan views showing a method of fabricating a three-dimensional semiconductor memory device according to an example embodiment of the inventive concepts.
Figure 12A:
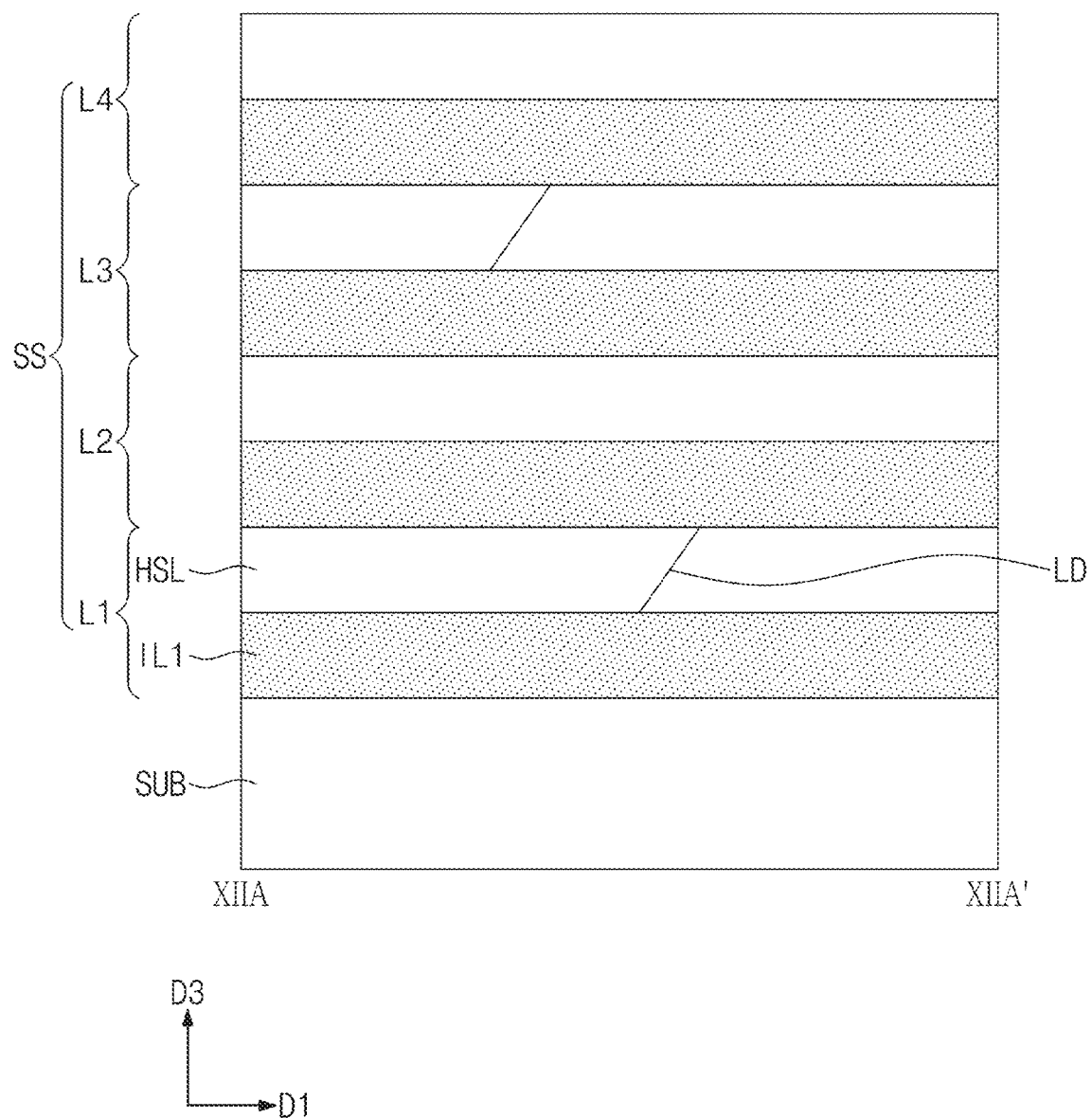
FIGS. 12A, 14A, 16A, 18A, 20A, 22A, and 24A illustrate cross-sectional views taken along line XIIA-XIIA' of FIG. 11, line XIVA-XIVA' of FIG. 13, line XVIA-XVIA' of FIG. 15, line XVIIIA-XVIIIA' of FIG. 17, line XXA-XXA' of FIG. 19, line XXIIA-XXIIA' of FIG. 21, and line XXIVA-XXIVA' of FIG. 23, respectively.
Figure 12B:
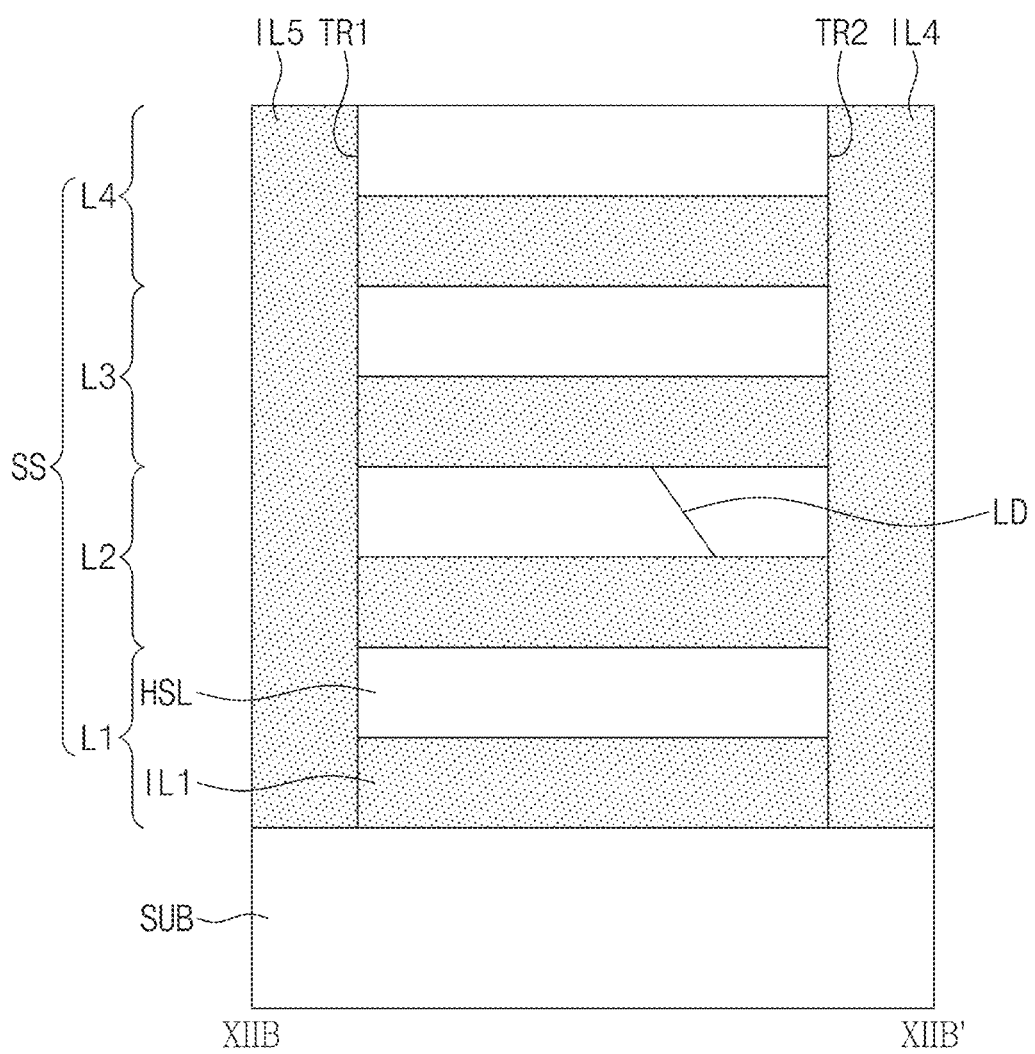
FIGS. 12B, 14B, 16B, 18B, 20B, 22B, and 24B illustrate cross-sectional views taken along line XIIB-XIIB' of FIG. 11, line XIVB-XIVB' of FIG. 13, line XVIB-XVIB' of FIG. 15, line XVIIIB-XVIIIB' of FIG. 17, line XXB-XXB' of FIG. 19, line XXIIB-XXIIB' of FIG. 21, and line XXIVB-XXIVB' of FIG. 23, respectively.

Referring to FIGS. 11, 12A, and 12B, the substrate SUB may be provided thereon with the stack structure SS shown above in FIGS. 10A and 10B. The first and second trenches TR1 and TR2 may be defined on opposite sides of the stack structure SS. The first trench TR1 may be filled with the fifth insulating layer IL5, and the second trench TR2 may be filled with the fourth insulating layer IL4. For example, the stack structure SS may be interposed between the fourth and fifth insulating layers IL4 and IL5. The following will describe an example where only the first to fourth layers L1 to L4 are illustrated in the stack structure SS. The inventive concepts, however, are not limited thereto, and the stack structure SS may further include one or more additional layers that are repeatedly stacked on the fourth layer L4.

Each of the first to fourth layers L1 and L4 of the stack structure SS may include the first insulating layer IL1 and the horizontal semiconductor layer HSL on the first insulating layer IL1. The horizontal semiconductor layer HSL may include a semiconductor material, for example, single-crystalline silicon. The first insulating layer IL1 may include one selected from a silicon oxide layer, a silicon nitride layer, a silicon oxynitride layer, a carbon-containing silicon oxide layer, a carbon-containing silicon nitride layer, or a carbon-containing silicon oxynitride layer. As discussed above, at least one of the horizontal semiconductor layer HSL may include the lattice defect LD. The following drawings omit the illustration of the lattice defect LD.

Figure 13:
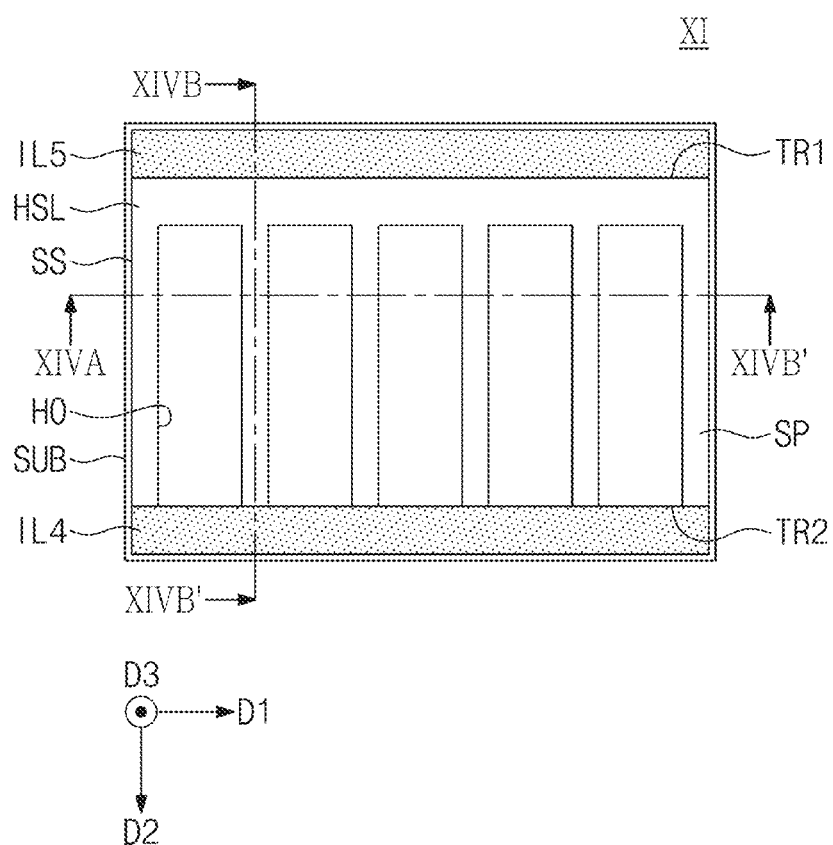
Figure 14A:
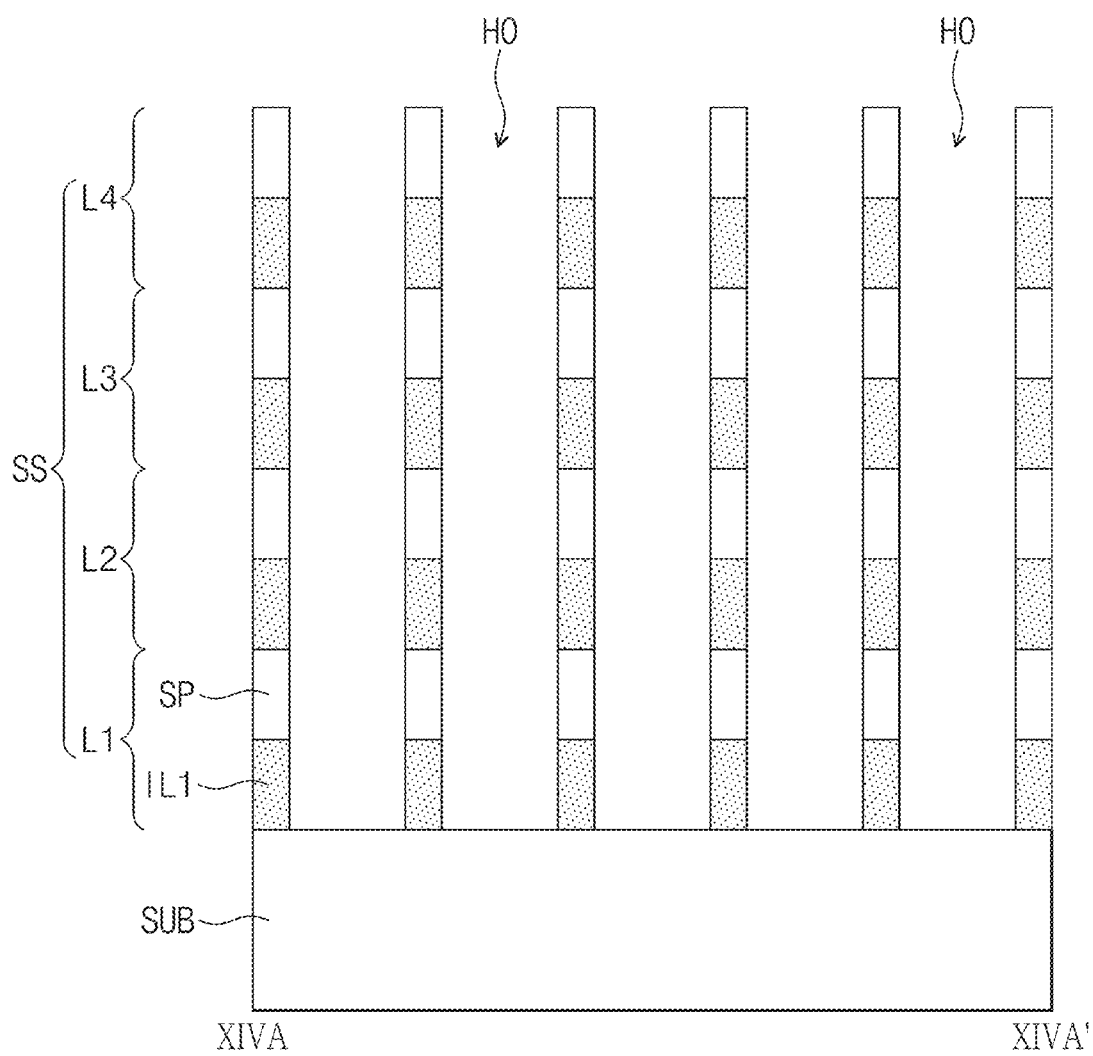
Figure 14B:
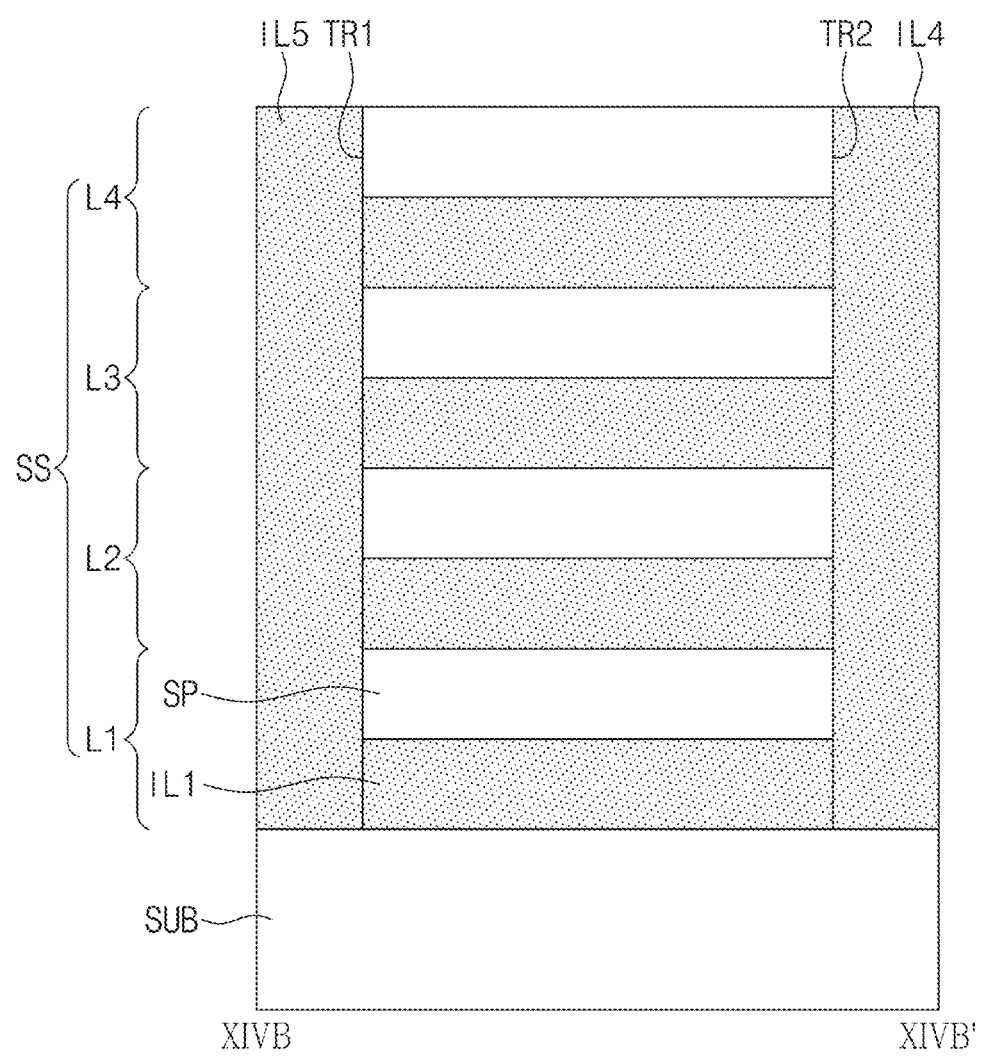

Referring to FIGS. 13, 14A, and 14B, the stack structure SS may be patterned to form holes HO that penetrate the stack structure SS. Each of the holes HO may have a linear or bar shape that extends in the second direction D2. The holes HO may be arranged spaced apart from each other along the first direction D1. The holes HO may define a plurality of semiconductor patterns SP on one horizontal semiconductor layer HSL. For example, the semiconductor pattern SP may be defined by a pair of neighboring holes HO. Each of the semiconductor patterns SP may have a bar shape that extends in the second direction D2. The semiconductor patterns SP may be arranged along the second direction D1 at a regular pitch.

Figure 15:
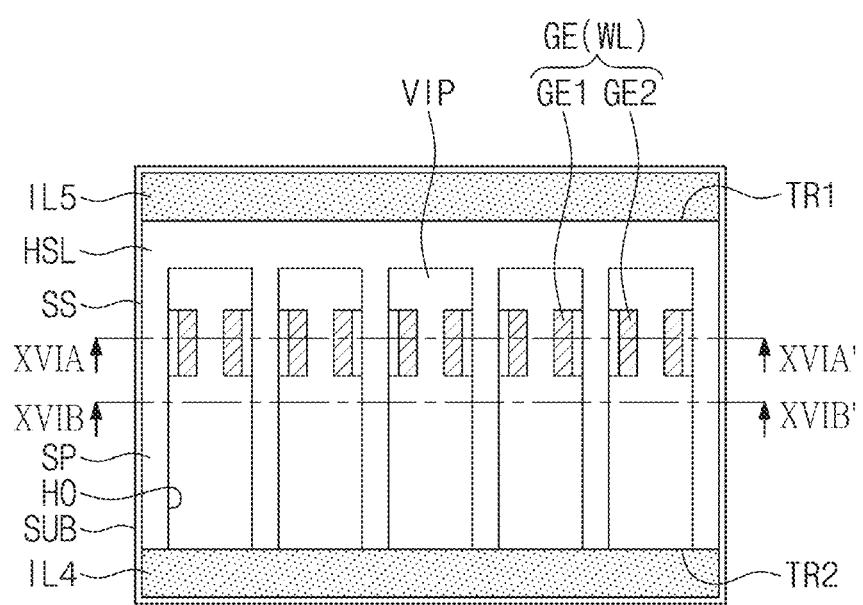
Figure 15:
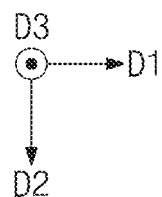
Figure 16A:
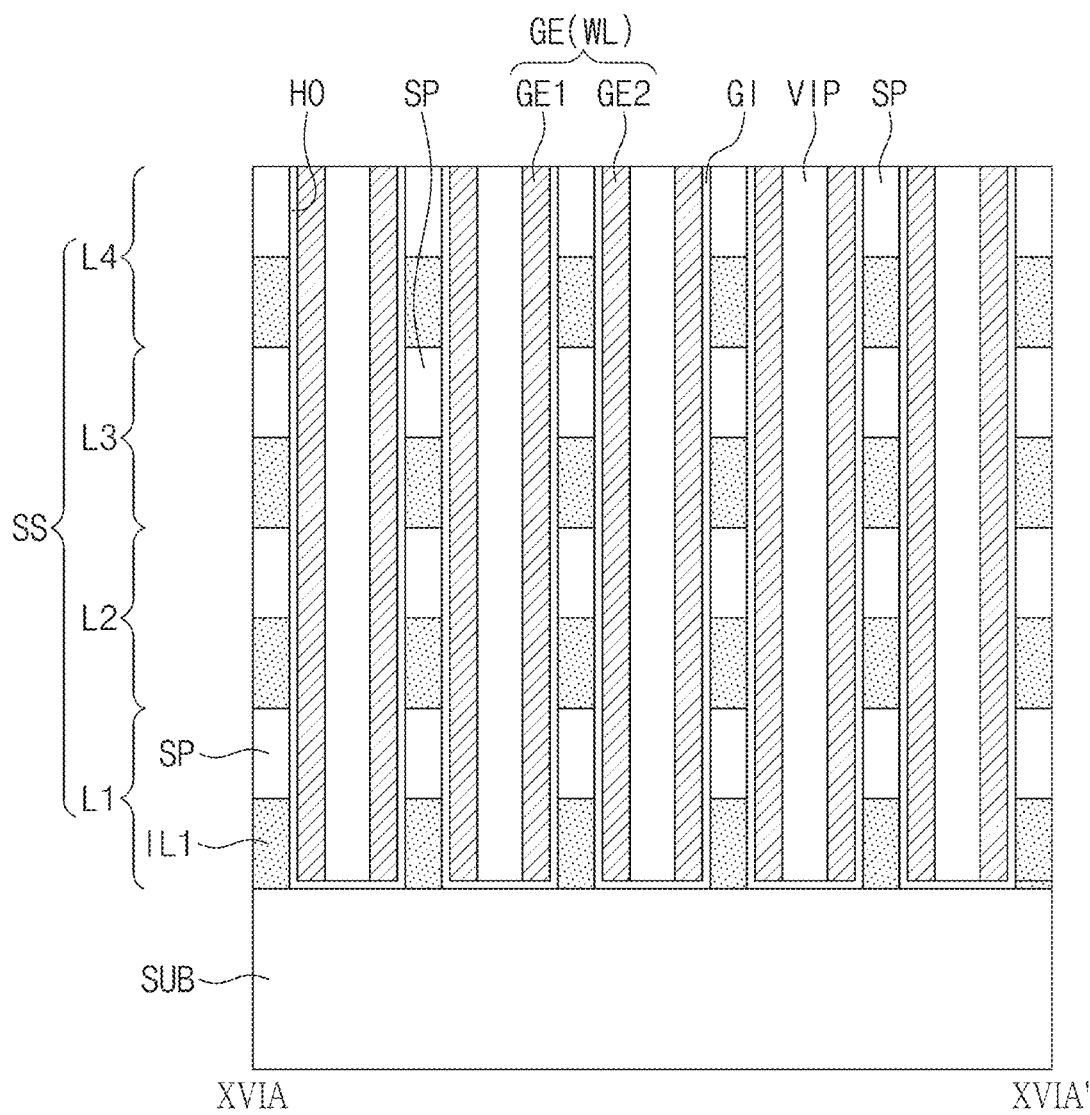
Figure 16B:
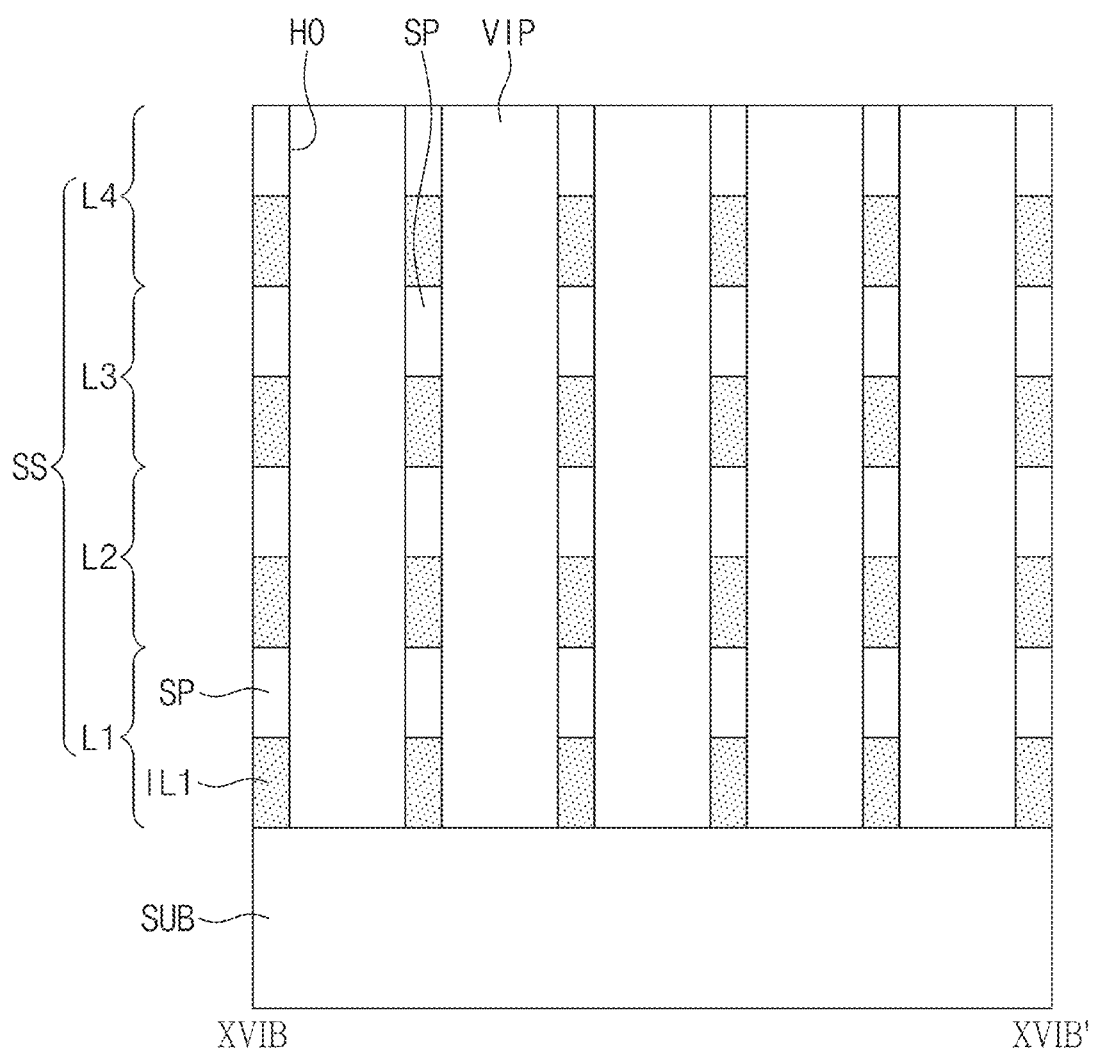

Referring to FIGS. 15, 16A, and 16B, gate electrodes GE and gate insulating layers GI may be formed in each of the holes HO. For example, a gate insulating layer and a gate electrode layer may be formed in the holes HO, and then may be patterned to form the gate insulating layers GI and the gate electrodes GE. The stack structure SS may have an inner sidewall exposed to the hole HO, and the gate electrode GE and the gate insulating layer GI may extend in a third direction D3 along the inner sidewall of the stack structure SS. The gate electrodes GE may include a first gate electrode GE1 and a second gate electrode GE2 that are provided on opposite sides of the semiconductor pattern SP.

After the formation of the gate electrodes GE, vertical insulating layers VIP may be formed to fill the holes HO. The vertical insulating layer VIP may include one or more of a silicon oxide layer, a silicon nitride layer, or a silicon oxynitride layer.

Figure 17:
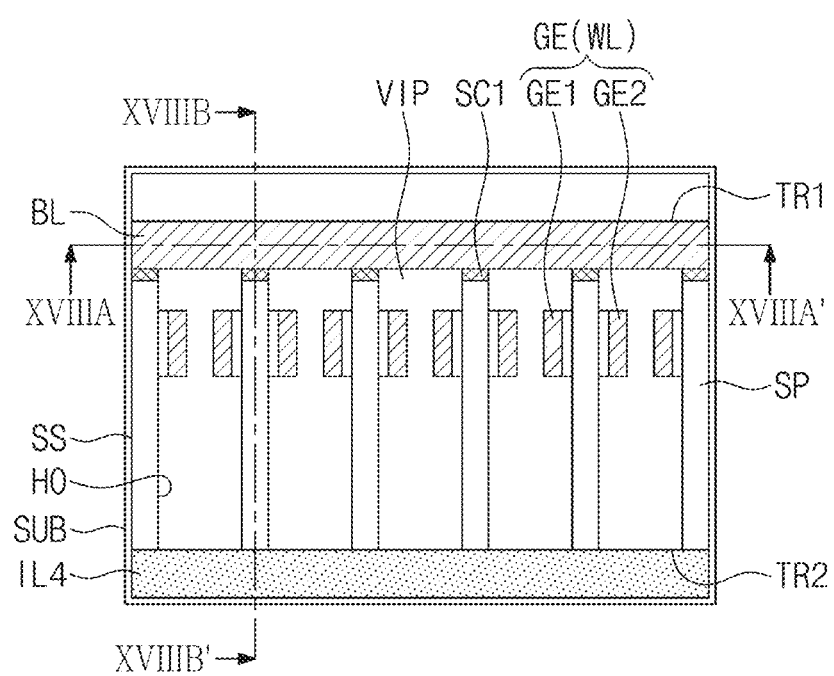
Figure 17:
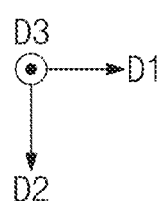
Figure 18A:
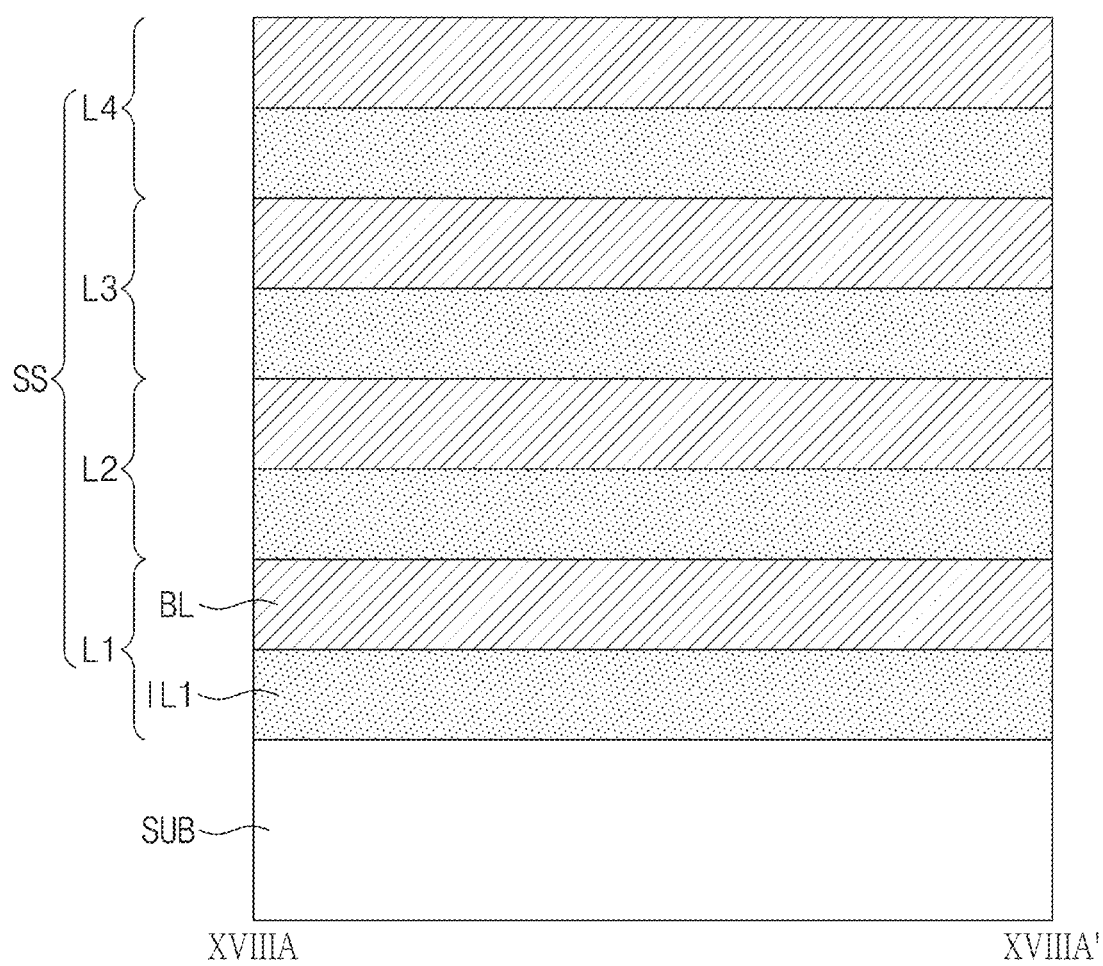
Figure 18B:
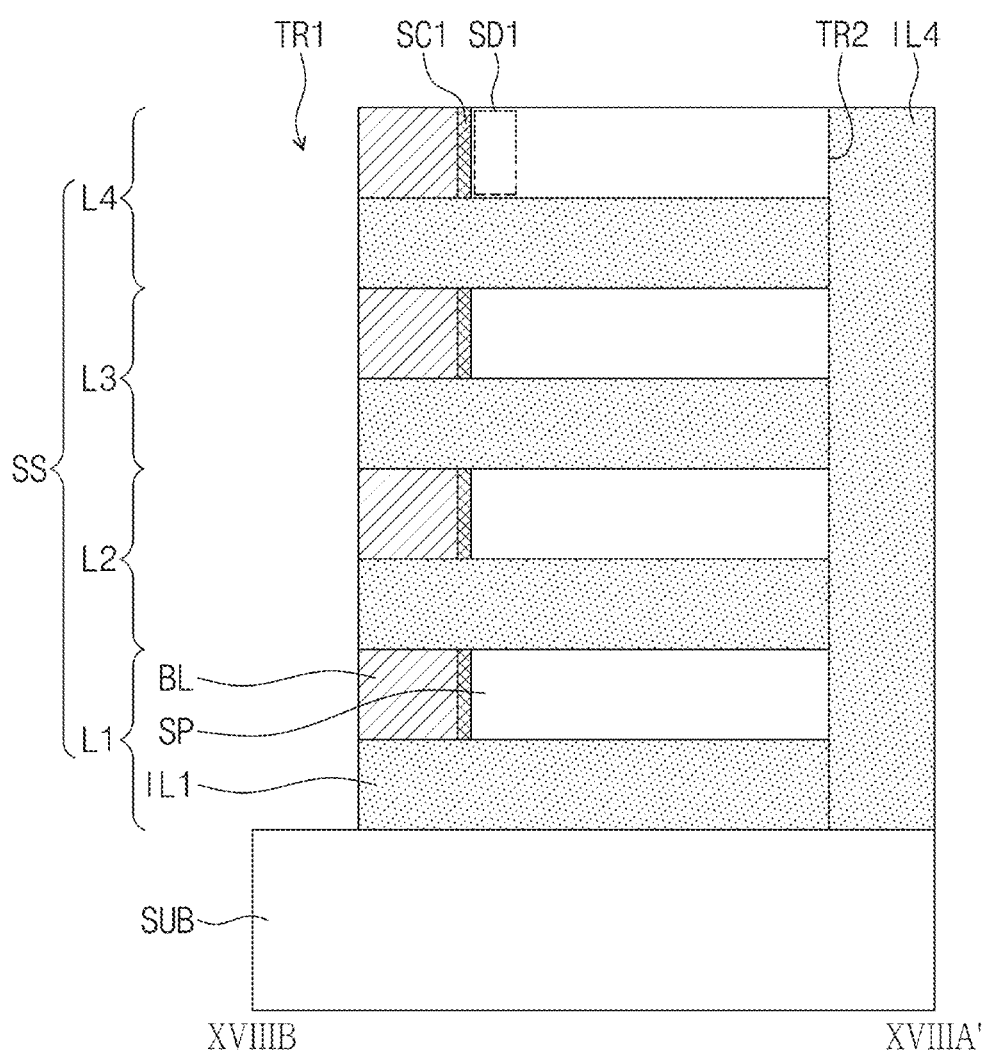

Referring to FIGS. 17, 18A, and 18B, a bit line BL may replace a portion of the horizontal semiconductor layer HSL except for the semiconductor patterns SP. For example, the fifth insulating layer IL5 may be selectively removed to expose one sidewall of the stack structure SS that is exposed to the first trench TR1. A wet etching process may be performed to selectively etch the horizontal semiconductor layer HSL on the one sidewall exposed to the first trench TR1. The etching process may partially remove the horizontal semiconductor layer HSL. A conductive material may be deposited on a location where the horizontal semiconductor layer HSL is removed, thereby forming the bit line BL. The bit line BL may extend in the first direction D1. The bit line BL may be electrically connected to the semiconductor patterns SP.

A first silicide pattern SC1 may be formed between the bit line BL and each of the semiconductor patterns SP. The formation of the first silicide pattern SC1 may include, before forming the first silicide pattern SC1, performing a silicidation reaction on the semiconductor patterns SP that are exposed by the partial removal of the horizontal semiconductor layer HSL.

First impurity regions SD1 may be formed in corresponding semiconductor patterns SP. The formation of the first impurity regions SD1 may include, before forming the bit line BL, introducing doping impurities into an end of the semiconductor pattern SP that is exposed by the partial removal of the horizontal semiconductor layer HSL.

Figure 19:
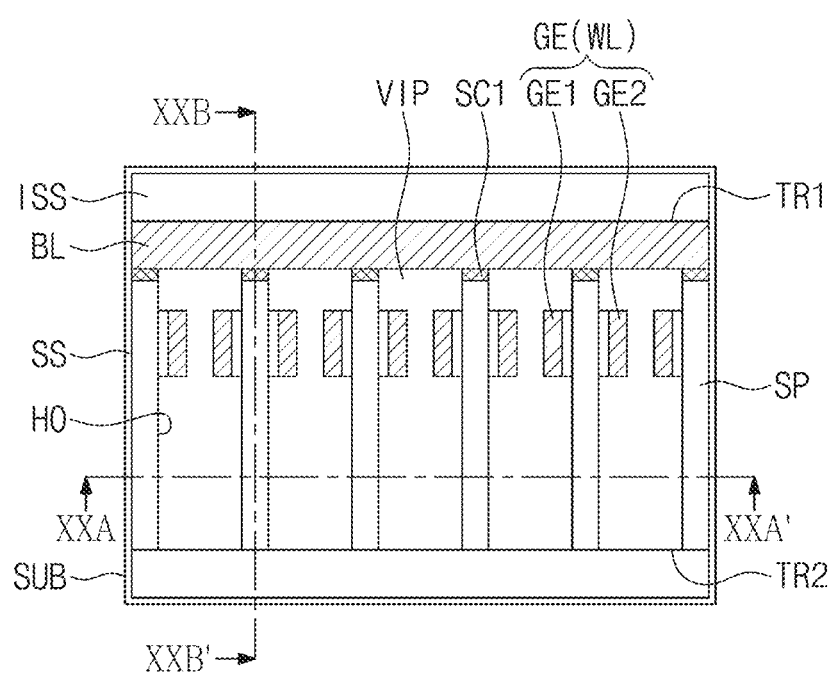
Figure 19:
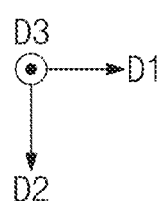
Figure 20A:
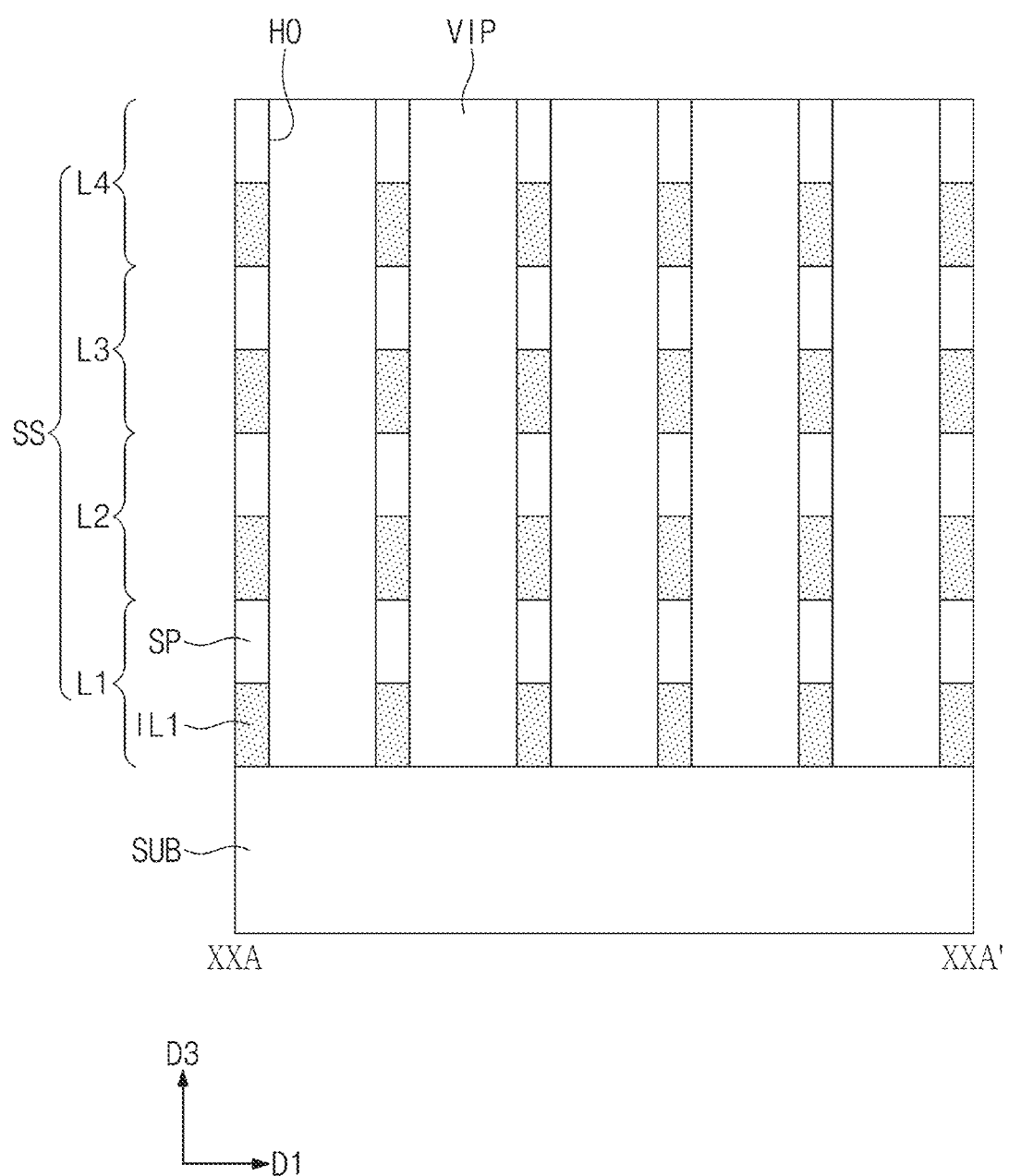
Figure 20B:
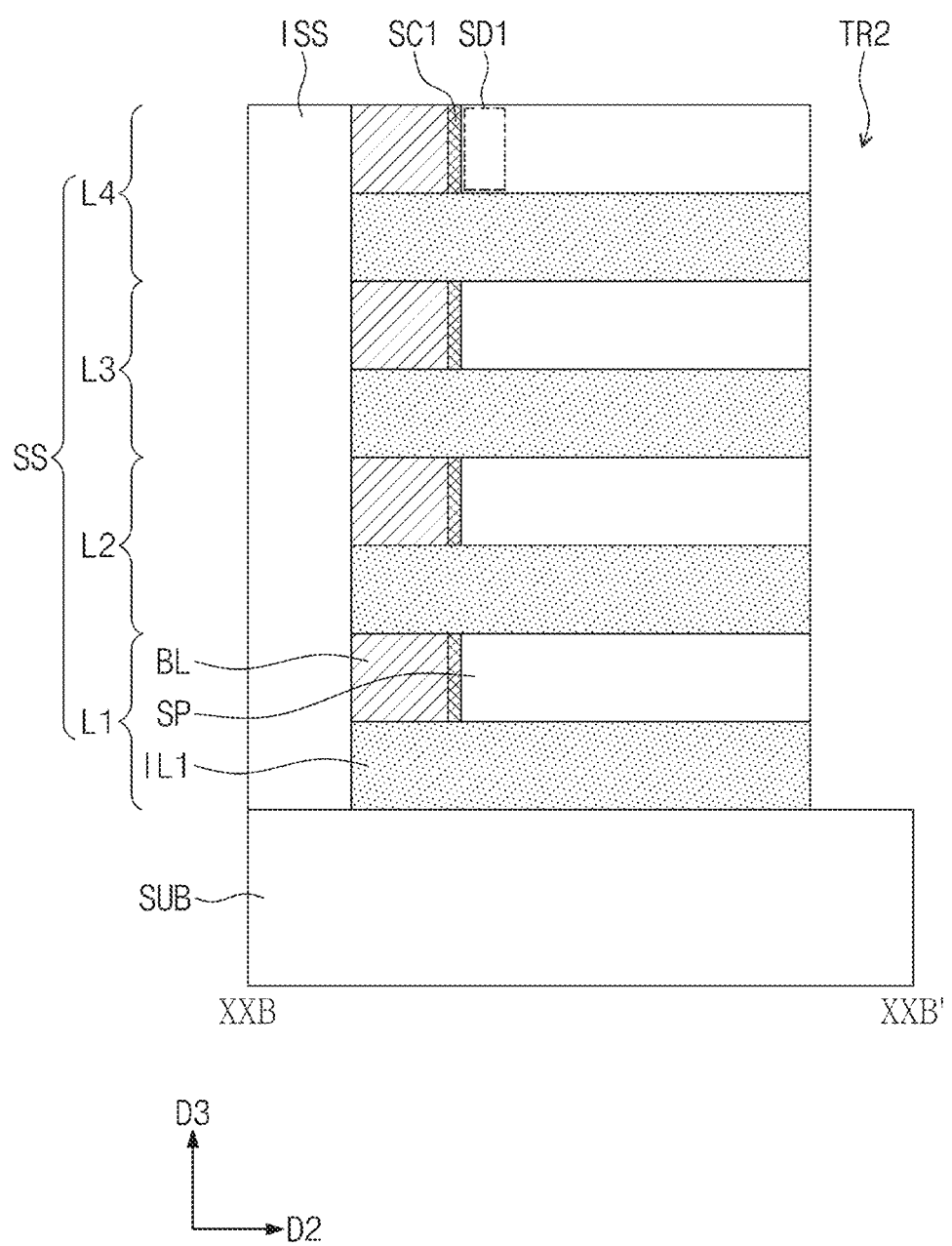

Referring to FIGS. 19, 20A, and 20B, an insulation structure ISS may be formed to fill the first trench TR1. The insulation structure ISS may include one or more of a silicon oxide layer, a silicon nitride layer, or a silicon oxynitride layer. The fourth insulating layer IL4 may be selectively removed to expose other sidewall of the stack structure SS exposed to the second trench TR2. The second trench TR2 may expose a sidewall of the vertical insulating layer VIP, sidewalls of the first insulating layers IL1 of the stack structure SS, and sidewalls of the semiconductor patterns SP of the stack structure SS.

Figure 21:
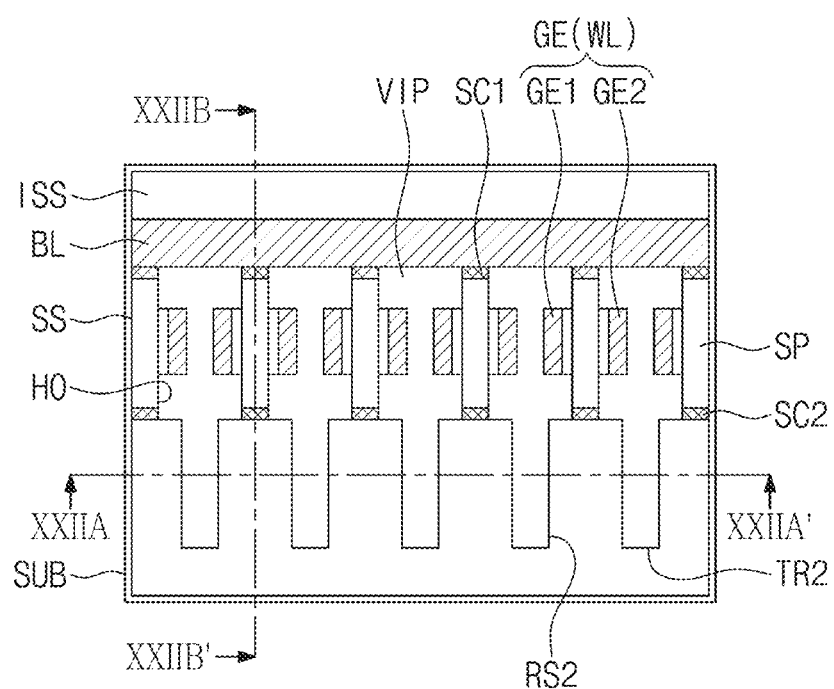
Figure 21:
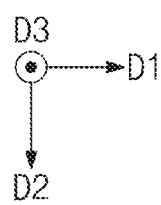
Figure 22A:
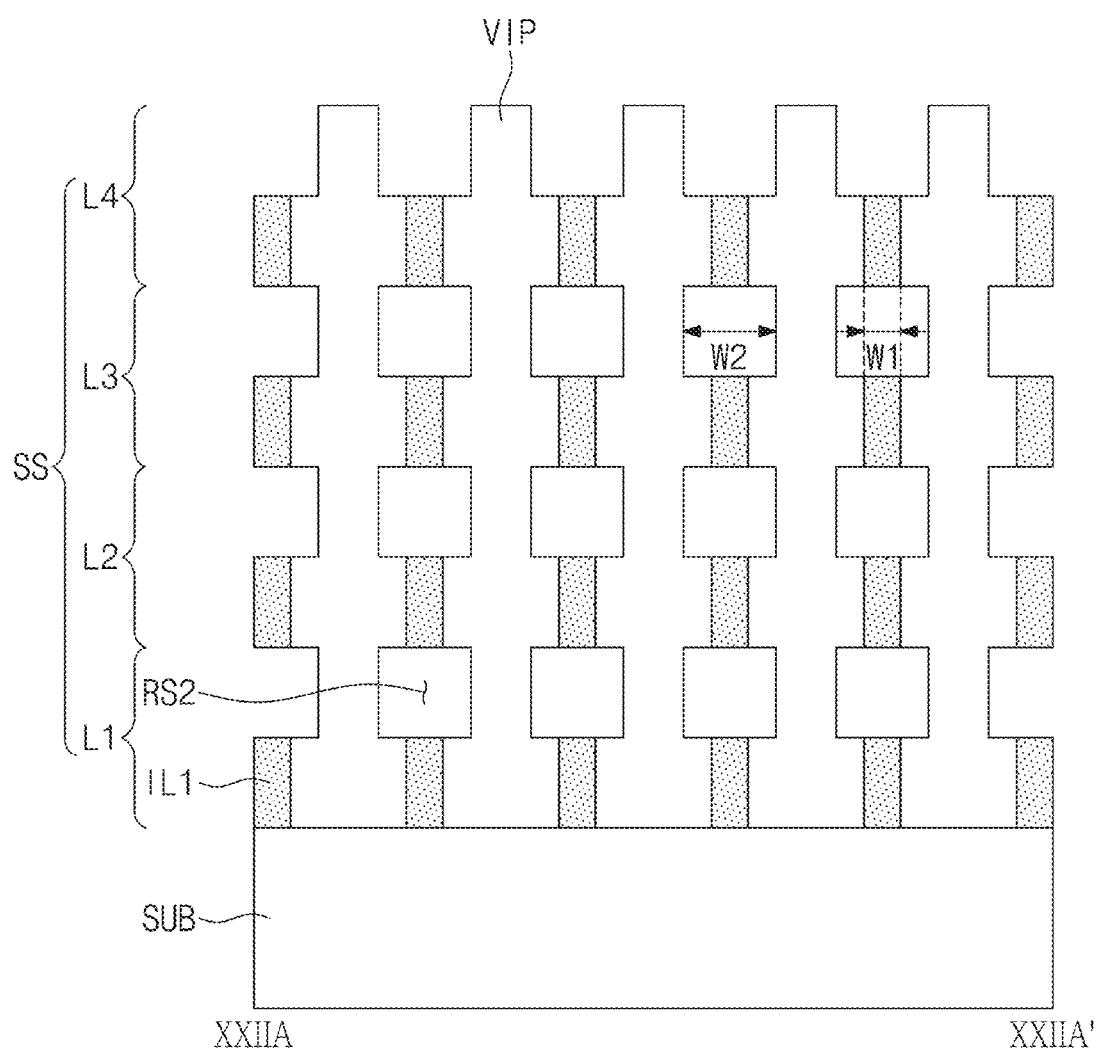
Figure 22B:
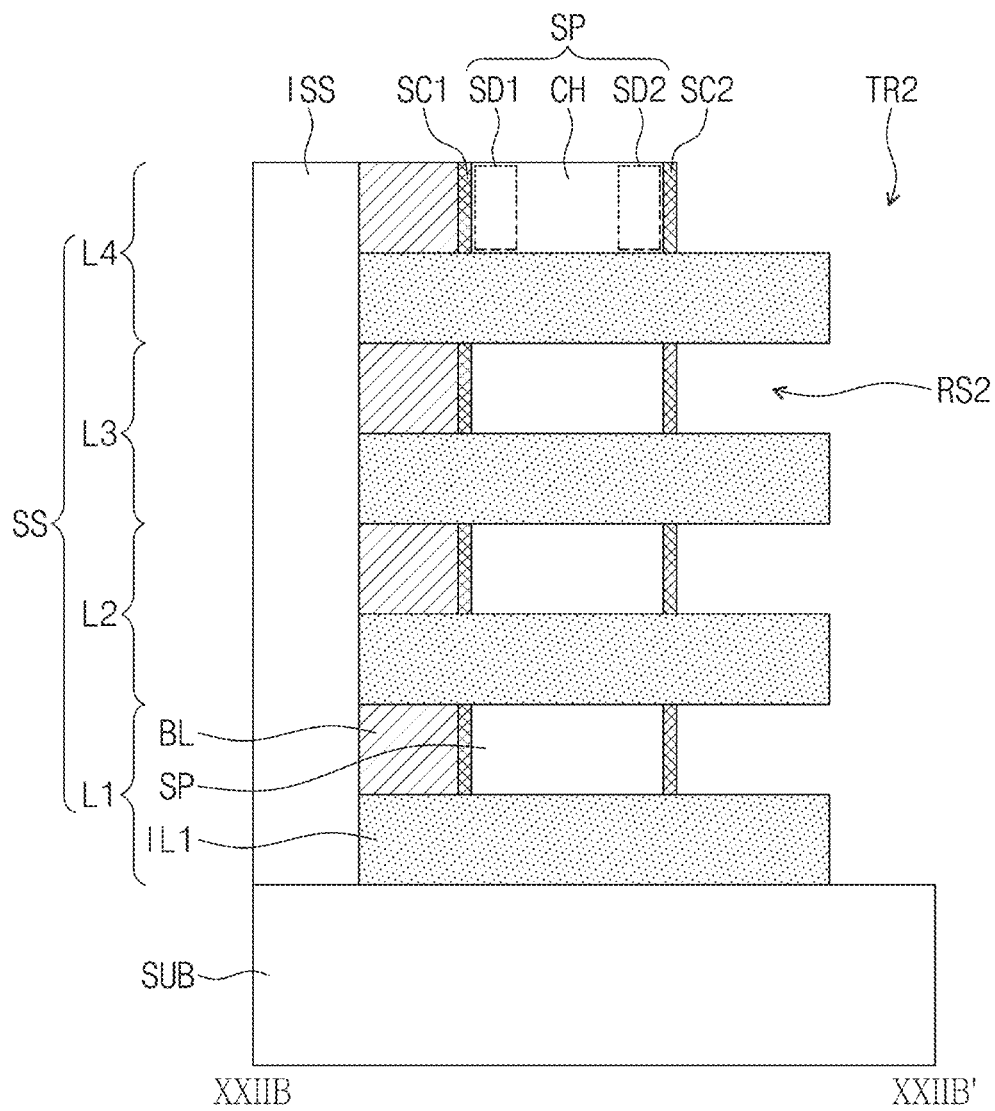

Referring to FIGS. 21, 22A, and 22B, the semiconductor patterns SP exposed to the second trench TR2 may be partially removed to form second recesses RS2. The formation of the second recesses RS2 may include performing a wet etching process to selectively etch the semiconductor patterns SP exposed to the second trench TR2.

The second recess RS2 may horizontally extend toward the bit line BL. The second recess RS2 may be surrounded by the first insulating layers IL1 and the vertical insulating layer VIP. The second recess RS2 may have a first width W1 in the first direction D1. The first width W1 may be the same as or substantially similar to a width of the semiconductor pattern SP.

The vertical insulating layer VIP may be selectively etched through the second recess RS2, and thus the second recess RS2 may expand in the first direction D1. Because the vertical insulating layer VIP is selectively etched, the vertical insulating layer VIP may be removed at its portion adjacent to the second recess RS2. The expansion may allow the second recess RS2 to have a second width W2 in the first direction D1. The second width W2 may be greater than the first width W1.

A second silicide pattern SC2 may be formed on the semiconductor pattern SP exposed to the second recess RS2. The formation of the second silicide pattern SC2 may include performing a silicidation reaction on the semiconductor pattern SP exposed to the second recess RS2.

Second impurity regions SD2 may be formed in corresponding semiconductor patterns SP. The formation of the second impurity regions SD2 may include, before forming the second silicide pattern SC2, introducing doping impurities into the semiconductor pattern SP exposed to the second recess RS2.

Figure 23:
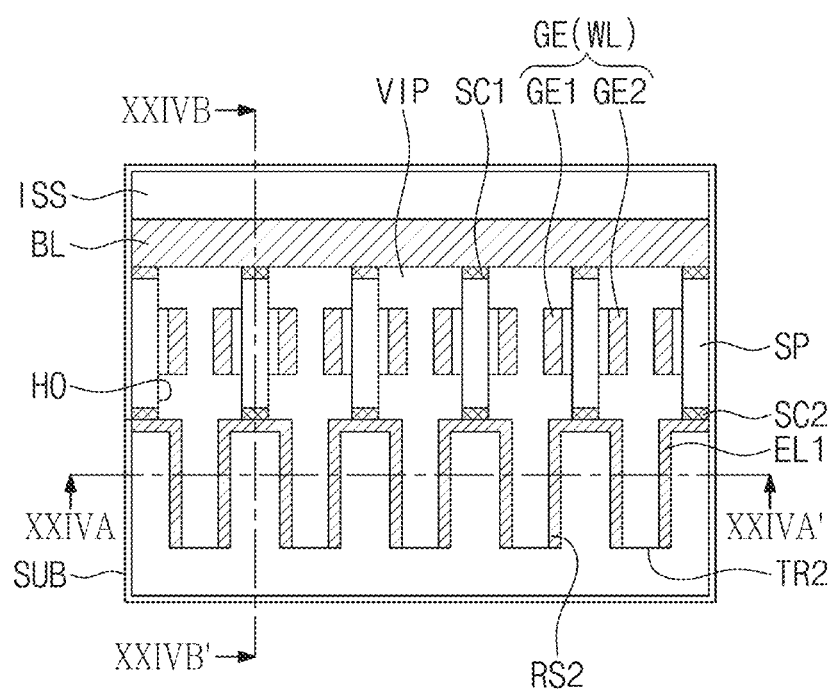
Figure 23:
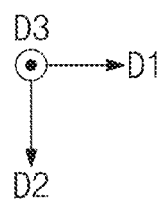
Figure 24A:
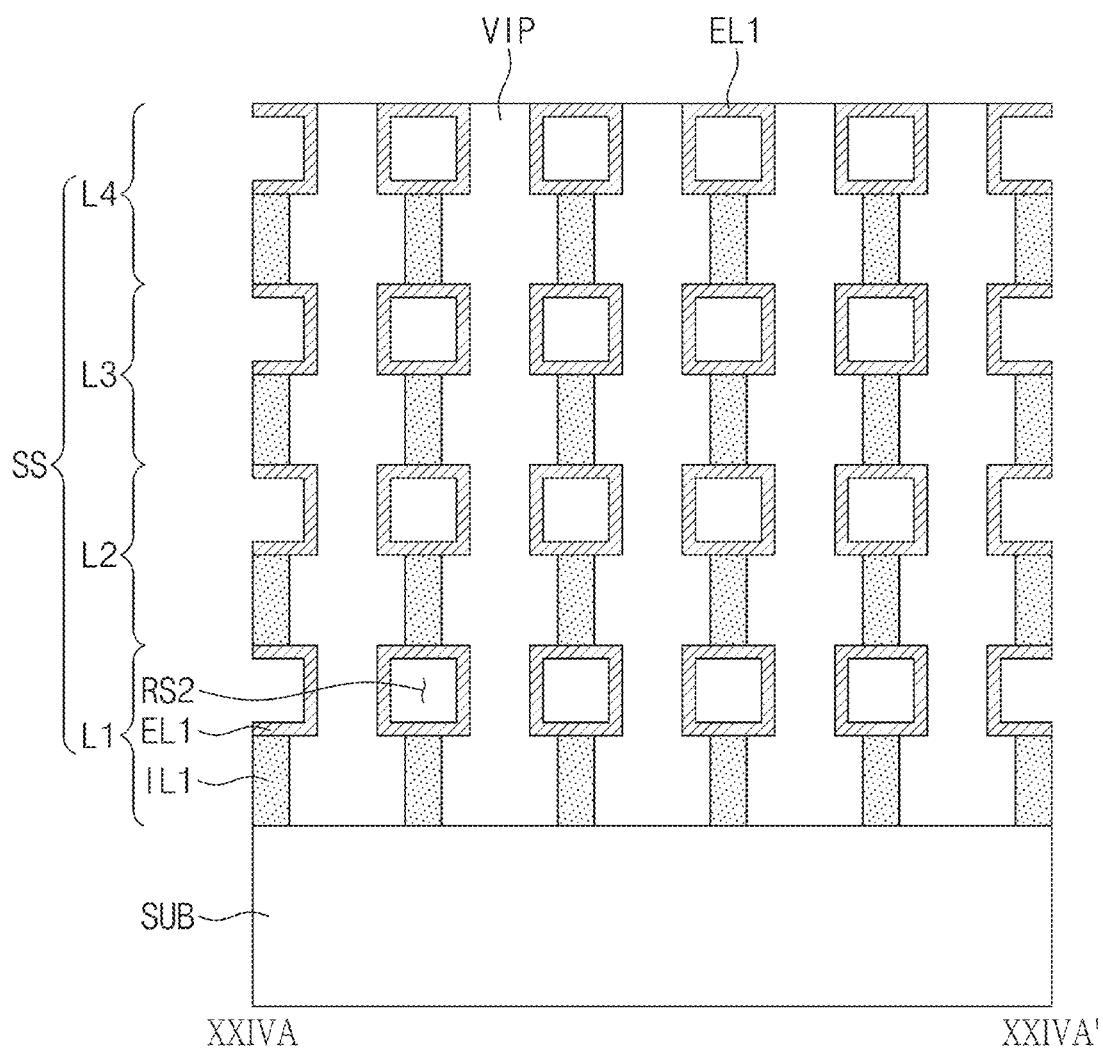
Figure 24B:
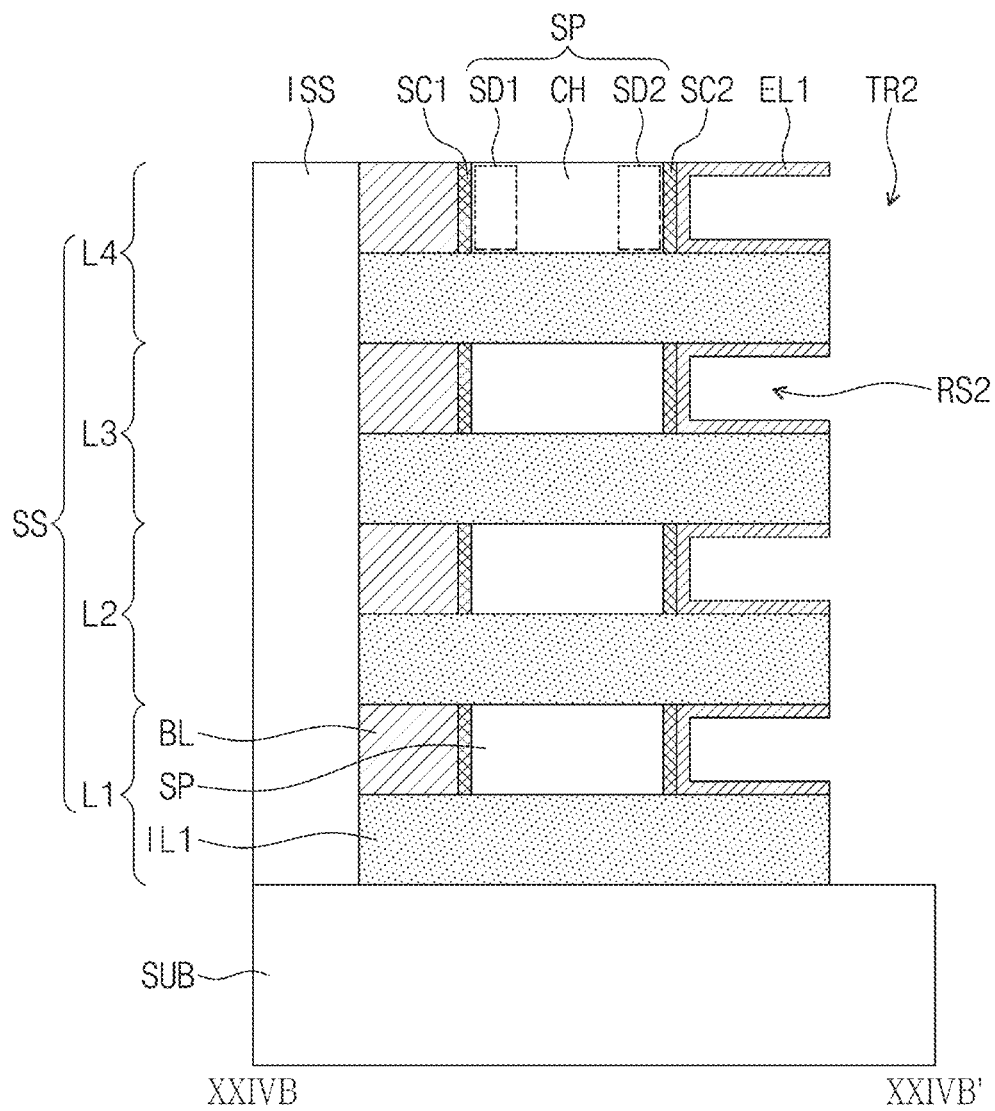

Referring to FIGS. 23, 24A, and 24B, first electrodes EL1 may be formed in corresponding second recesses RS2. For example, the formation of the first electrodes EL1 may include conformally forming a first electrode layer in the second recesses RS2, and performing a wet etching process to divide the first electrode layer into a plurality of first electrodes ELL The first electrode EL1 may thus have a cylindrical shape, one end of which is opened.

Referring back to FIGS. 3, 4A to 4C, a dielectric layer DL may be conformally formed on the first electrodes ELL The dielectric layer DL may cover an exposed surface of the first electrode ELL A second electrode EL2 may be formed on the dielectric layer DL. The second electrode EL2 may completely fill the second trench TR2 and the second recesses RS2. The first electrode ELL the dielectric layer DL, and the second electrode EL2 may constitute a data storage element DS.

In device fabrication methods according to some example embodiments of the inventive concepts, the vertical semiconductor layer VSL and the horizontal semiconductor layer HSL may be used to form vertically stacked semiconductor patterns SP each having the same crystal structure as that of the substrate SUB. For example, the semiconductor patterns SP may be formed of single-crystalline silicon which are used as channels of a semiconductor memory device according to some example embodiments of the inventive concepts. Accordingly, the semiconductor memory device of the inventive concepts may improve in reliability and electrical characteristics.

According to some example embodiments of the inventive concepts, a three-dimensional semiconductor memory device may include stacked semiconductor patterns formed of single-crystalline silicon and used as channels. Thus, the three-dimensional semiconductor memory device may improve in electrical characteristics.

According to some example embodiments of the inventive concepts, a device fabrication method may simultaneously grow horizontal semiconductor layers from a vertical semiconductor layer. For example, the horizontal semiconductor layers may be formed along a crystal structure of a vertical semiconductor layer. Thus, it may be possible to easily achieve a three-dimensional semiconductor memory device and to increase reliability of the device.

Although some example embodiments of the inventive concepts have been discussed with reference to accompanying figures, it will be understood that various changes in form and details may be made therein without departing from the spirit and scope of the inventive concepts. It therefore will be understood that the disclosed example embodiments described above are just illustrative but not limitative in all aspects.

What is claimed is:

1. A method of fabricating a semiconductor memory device, the method comprising:
    forming a mold structure by alternately stacking a plurality of first insulating layers and a plurality of second insulating layers on a substrate;
    patterning the mold structure to form a first trench that exposes a first inner sidewall of the mold structure;
    growing a vertical semiconductor layer in the first trench such that the vertical semiconductor layer covers the first inner sidewall, using the substrate as a seed;
    patterning the mold structure to form a second trench that exposes a second inner sidewall of the mold structure;
    forming a plurality of recesses by selectively removing the second insulating layers from the mold structure through the second trench; and
    horizontally growing a plurality of horizontal semiconductor layers in corresponding recesses, using the vertical semiconductor layer as a seed,
    wherein when the horizontal semiconductor layers are grown, a lattice defect occurs in at least one of the horizontal semiconductor layers, and
    the lattice defect obliquely extends from a bottom surface of a corresponding one of the horizontal semiconductor layers toward a top surface of the corresponding one of the horizontal semiconductor layers.

2. The method of claim 1, wherein the horizontal semiconductor layers are simultaneously grown from the vertical semiconductor layer.

3. The method of claim 1, wherein the vertical semiconductor layer is grown to have a single-crystalline structure along a first crystal structure of the substrate.

4. The method of claim 3, wherein the horizontal semiconductor layers are grown to have a single-crystalline structure along a second crystal structure of the vertical semiconductor layer.

5. The method of claim 1, wherein forming the vertical semiconductor layer includes:
    forming, in the first trench, a spacer that covers the first inner sidewall;
    forming a third insulating layer that fills the first trench; and
    replacing the spacer with the vertical semiconductor layer.

6. The method of claim 5, further comprising:
    after horizontally growing the horizontal semiconductor layers, selectively removing the third insulating layer; and
    selectively removing the vertical semiconductor layer.

7. The method of claim 1, further comprising:
    patterning the horizontal semiconductor layers to form a plurality of semiconductor patterns that are arranged in a first direction;
    forming a bit line that extends in the first direction such that the semiconductor patterns are electrically connected to the bit line; and forming a data storage element electrically connected to each of the semiconductor patterns.

8. The method of claim 7, further comprising:
forming a gate electrode vertically extending along the semiconductor patterns.

9. A semiconductor memory device, comprising:
a stack structure including a plurality of layers vertically stacked on a substrate, each of the plurality of layers including a bit line extending in a first direction and a semiconductor pattern extending in a second direction from the bit line, the second direction intersecting the first direction;
a gate electrode penetrating the stack structure and vertically extending along the semiconductor pattern included in each of the plurality of layers; and
a data storage element electrically connected to the semiconductor pattern,
wherein the data storage element includes,
a first electrode electrically connected to the semiconductor pattern,
a second electrode on the first electrode, and
a dielectric layer between the first electrode and the second electrode, and
wherein the semiconductor pattern has a lattice defect that obliquely extends from a bottom surface of the semiconductor pattern toward a top surface of the semiconductor pattern.

10. The device of claim 9, wherein the semiconductor pattern includes single-crystalline silicon.

11. The device of claim 9, further comprising:
a first silicide pattern between the semiconductor pattern and the bit line; and
a second silicide pattern between the semiconductor pattern and the first electrode.

12. The device of claim 9, wherein the semiconductor pattern includes:
a first impurity region electrically connected to the bit line;
a second impurity region electrically connected to the first electrode; and
a channel region between the first and second impurity regions and adjacent to the gate electrode.

13. The device of claim 9, wherein the gate electrode includes:
a first gate electrode adjacent to a first side of the semiconductor pattern; and
a second gate electrode adjacent to a second side of the semiconductor pattern, the second side being opposite to the first side.

14. A semiconductor memory device, comprising:
a stack structure including a plurality of layers vertically stacked on a substrate, each of the plurality of layers including an insulating layer, a bit line extending in a first direction on the insulating layer, and a semiconductor pattern extending in a second direction from the bit line, the second direction intersecting the first direction;
a gate electrode penetrating the stack structure and vertically extending along the semiconductor pattern included in each of the plurality of layers; and
a data storage element electrically connected to the semiconductor pattern,
wherein the data storage element includes,
a first electrode electrically connected to the semiconductor pattern,
a second electrode on the first electrode, and
a dielectric layer between the first electrode and the second electrode,
wherein the semiconductor pattern has a lattice defect therein, and
wherein the lattice defect is at an angle of 50° to 60° with respect to a top surface of the insulating layer below the semiconductor pattern.

15. The device of claim 14, wherein the semiconductor pattern includes single-crystalline silicon.

16. The device of claim 14, further comprising:
a first silicide pattern between the semiconductor pattern and the bit line; and
a second silicide pattern between the semiconductor pattern and the first electrode.

17. The device of claim 14, wherein the semiconductor pattern includes:
a first impurity region electrically connected to the bit line;
a second impurity region electrically connected to the first electrode; and
a channel region between the first and second impurity regions and adjacent to the gate electrode.

18. The device of claim 14, wherein the gate electrode includes:
a first gate electrode adjacent to a first side of the semiconductor pattern; and
a second gate electrode adjacent to a second side of the semiconductor pattern, the second side being opposite to the first side.

* * * * *